(12) United States Patent
Cao et al.

(10) Patent No.: US 10,007,007 B2
(45) Date of Patent: Jun. 26, 2018

(54) METHODS FOR MAKING AN X-RAY DETECTOR

(71) Applicant: SHENZHEN XPECTVISION TECHNOLOGY CO., LTD., Shenzhen (CN)

(72) Inventors: Peiyan Cao, Shenzhen (CN); Yurun Liu, Shenzhen (CN)

(73) Assignee: SHENZHEN XPECTVISION TECHNOLOGY CO., LTD., Shenzhen (CN)

( * ) Notice: Subject to any disclaimer, the term of this patent is extended or adjusted under 35 U.S.C. 154(b) by 138 days.

(21) Appl. No.: 15/309,085

(22) PCT Filed: Sep. 8, 2015

(86) PCT No.: PCT/CN2015/089103
§ 371 (c)(1),
(2) Date: Nov. 4, 2016

(87) PCT Pub. No.: WO2017/041221
PCT Pub. Date: Mar. 16, 2017

(65) Prior Publication Data
US 2017/0269237 A1   Sep. 21, 2017

(51) Int. Cl.
*G01T 1/24* (2006.01)

(52) U.S. Cl.
CPC ..................... *G01T 1/24* (2013.01)

(58) Field of Classification Search
CPC ..... G01T 1/2018; G01T 1/202; G01T 1/2985; H01L 27/14661
See application file for complete search history.

(56) References Cited

U.S. PATENT DOCUMENTS

| | | |
|---|---|---|
| 5,245,191 A | 9/1993 | Barber et al. |
| 5,389,792 A | 2/1995 | Dimarzio et al. |
| 6,107,619 A * | 8/2000 | Cunningham .... H01L 27/14634 250/208.1 |

(Continued)

FOREIGN PATENT DOCUMENTS

| | | |
|---|---|---|
| CN | 1675780 A | 9/2005 |
| CN | 1892250 A | 1/2007 |

(Continued)

*Primary Examiner* — Kiho Kim
(74) *Attorney, Agent, or Firm* — IPro, PLLC; Qian Gu; Na Xu

(57) ABSTRACT

Disclosed herein is an apparatus suitable for detecting X-ray, the apparatus comprising: a first substrate comprising a plurality of first electric contacts; a first chip layer comprising a plurality of first chips, wherein each of the first chips comprises a first electrode and is bonded to the first substrate such that the first electrode is electrically connected to at least one of the first electrical contacts; a second substrate comprising a plurality of second electric contacts; and a second chip layer comprising a plurality of second chips, wherein each of the second chips comprises a second electrode and is bonded to the second substrate such that the second electrode is electrically connected to at least one of the second electrical contacts, wherein the first chip layer and the second chip layer are bonded to each other such that at least two second chips are bonded to a same first chip.

29 Claims, 33 Drawing Sheets

(56) References Cited

U.S. PATENT DOCUMENTS

| | | | |
|---|---|---|---|
| 6,510,195 B1* | 1/2003 | Chappo | G01T 1/2018 250/208.1 |
| 7,189,971 B2* | 3/2007 | Spartiotis | G01T 1/2928 250/370.09 |
| 7,361,881 B2* | 4/2008 | Spartiotis | G01T 1/2928 250/208.1 |
| 8,796,811 B2* | 8/2014 | Shubin | H01L 27/1465 257/227 |
| 8,859,975 B2* | 10/2014 | Tokura | G01T 1/2018 250/366 |
| 9,915,741 B2* | 3/2018 | Cao | G01T 1/2928 |
| 2002/0021786 A1* | 2/2002 | Hamamoto | H04N 3/1575 378/189 |
| 2002/0086515 A1* | 7/2002 | Fukuyama | H01L 21/4853 438/616 |
| 2004/0124007 A1* | 7/2004 | Ashida | H05K 1/111 174/260 |
| 2006/0050160 A1 | 3/2006 | Suzuki et al. | |
| 2006/0055017 A1* | 3/2006 | Cho | H01L 25/105 257/686 |
| 2008/0111247 A1* | 5/2008 | Sakinada | B23K 1/0016 257/778 |
| 2008/0185030 A1* | 8/2008 | Pierce | H01L 35/32 136/203 |
| 2008/0194047 A1* | 8/2008 | Sato | H01L 22/12 438/15 |
| 2009/0039273 A1 | 2/2009 | Tkaczyk et al. | |
| 2009/0290680 A1* | 11/2009 | Tumer | G01T 1/247 378/62 |
| 2010/0020924 A1 | 1/2010 | Steadman et al. | |
| 2010/0181491 A1 | 7/2010 | Karim et al. | |
| 2010/0225837 A1 | 9/2010 | Seki et al. | |
| 2011/0006195 A1* | 1/2011 | Prendergast | G01T 1/2907 250/252.1 |
| 2011/0089577 A1* | 4/2011 | Eom | H01L 25/50 257/778 |
| 2014/0110595 A1 | 4/2014 | Iwakiri et al. | |
| 2014/0326892 A1* | 11/2014 | Ootorii | H01L 27/14663 250/366 |
| 2014/0334600 A1 | 11/2014 | Lee et al. | |
| 2016/0064184 A1* | 3/2016 | Brown | H01J 37/244 250/307 |
| 2016/0099229 A1* | 4/2016 | Choi | H01L 25/0657 257/737 |
| 2017/0307766 A1* | 10/2017 | Abenaim | G01T 1/244 |
| 2018/0033731 A1* | 2/2018 | Betsui | H01L 23/538 |

FOREIGN PATENT DOCUMENTS

| | | |
|---|---|---|
| CN | 1947660 A | 4/2007 |
| CN | 101389978 A | 3/2009 |
| CN | 101578535 A | 11/2009 |
| CN | 101600974 A | 12/2009 |
| CN | 101644780 A | 2/2010 |
| CN | 101862200 A | 10/2010 |
| CN | 101903802 A | 12/2010 |
| CN | 102016637 A | 4/2011 |
| CN | 102124372 A | 7/2011 |
| CN | 101297221 B | 1/2012 |
| CN | 102655159 A | 9/2012 |
| CN | 102805628 A | 12/2012 |
| CN | 103109205 A | 5/2013 |
| CN | 103296035 A | 9/2013 |
| CN | 101578535 B | 11/2013 |
| CN | 103430533 A | 12/2013 |
| CN | 103576179 A | 2/2014 |
| CN | 103592673 A | 2/2014 |
| CN | 103633187 A | 3/2014 |
| CN | 103715214 A | 4/2014 |
| CN | 103975580 A | 8/2014 |
| CN | 104434152 A | 3/2015 |
| DE | 102012215818 A1 | 3/2014 |
| JP | 2002217444 A | 8/2002 |
| JP | 2004362905 A | 12/2004 |
| JP | 4734224 B2 | 7/2011 |
| JP | 2013142578 A | 7/2013 |
| KR | 101410736 B1 | 6/2014 |
| WO | WO-02103391 A1 | 12/2002 |
| WO | WO-2013012809 A1 | 1/2013 |

* cited by examiner

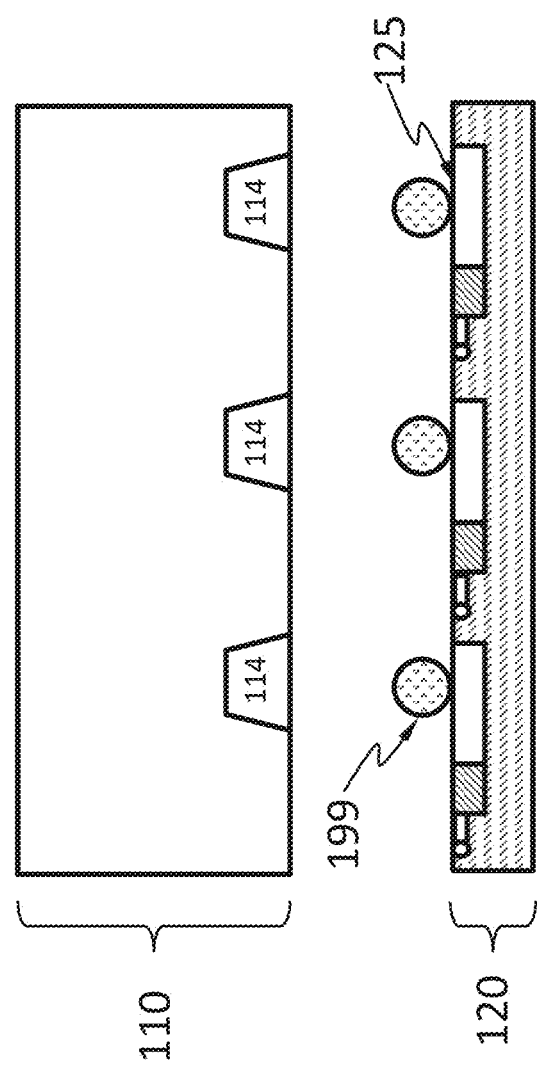

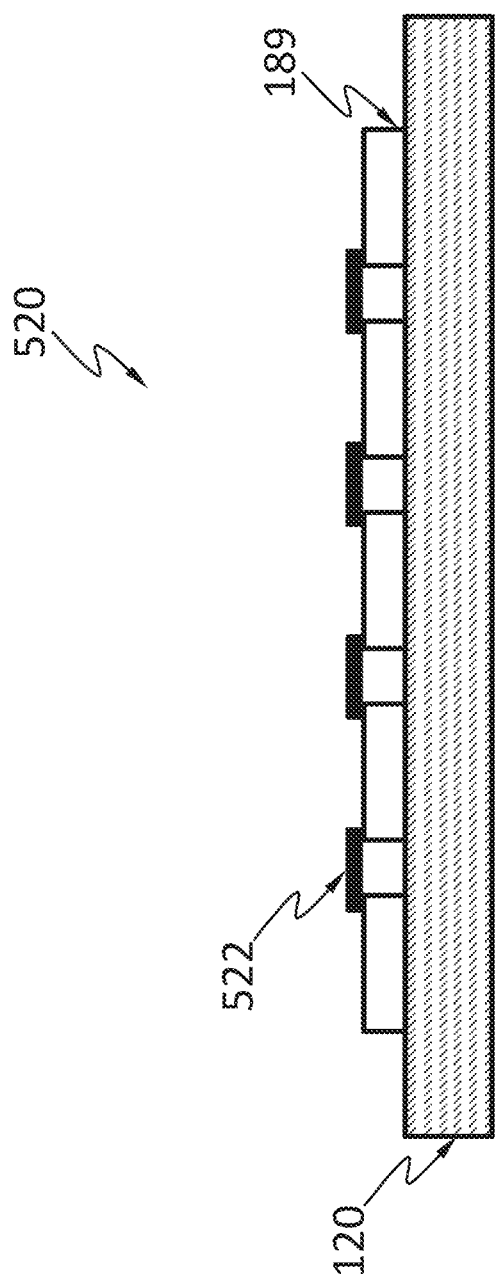

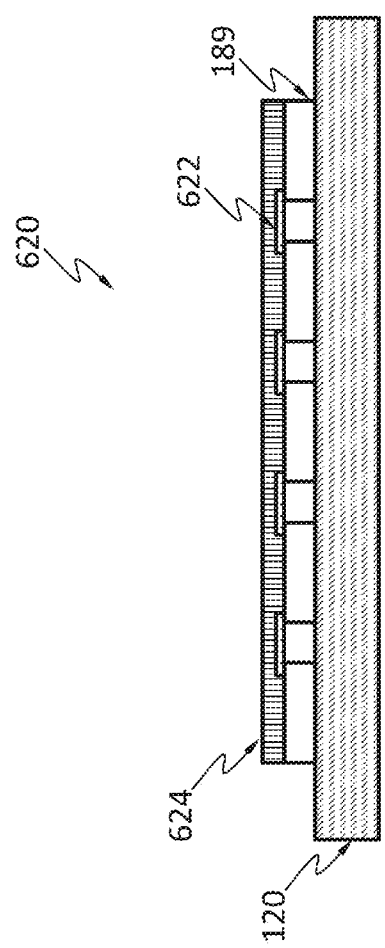

METHODS FOR MAKING AN X-RAY DETECTOR

TECHNICAL FIELD

The disclosure herein relates to X-ray detectors, particularly relates to methods for making semiconductor X-ray detectors.

BACKGROUND

X-ray detectors may be devices used to measure the flux, spatial distribution, spectrum or other properties of X-rays.

X-ray detectors may be used for many applications. One important application is imaging. X-ray imaging is a radiography technique and can be used to reveal the internal structure of a non-uniformly composed and opaque object such as the human body.

Early X-ray detectors for imaging include photographic plates and photographic films. A photographic plate may be a glass plate with a coating of light-sensitive emulsion. Although photographic plates were replaced by photographic films, they may still be used in special situations due to the superior quality they offer and their extreme stability. A photographic film may be a plastic film (e.g., a strip or sheet) with a coating of light-sensitive emulsion.

In the 1980s, photostimulable phosphor plates (PSP plates) became available. A PSP plate may contain a phosphor material with color centers in its lattice. When the PSP plate is exposed to X-ray, electrons excited by X-ray are trapped in the color centers until they are stimulated by a laser beam scanning over the plate surface. As the plate is scanned by laser, trapped excited electrons give off light, which is collected by a photo multiplier tube. The collected light is converted into a digital image. In contrast to photographic plates and photographic films, PSP plates can be reused.

Another kind of X-ray detectors are X-ray image intensifiers. Components of an X-ray image intensifier are usually sealed in a vacuum. In contrast to photographic plates, photographic films, and PSP plates, X-ray image intensifiers may produce real-time images, i.e., not requiring post-exposure processing to produce images. X-ray first hits an input phosphor (e.g., cesium iodide) and is converted to visible light. The visible light then hits a photocathode (e.g., a thin metal layer containing cesium and antimony compounds) and causes emission of electrons. The number of emitted electrons is proportional to the intensity of the incident X-ray. The emitted electrons are projected, through electron optics, onto an output phosphor and cause the output phosphor to produce a visible-light image.

Scintillators operate somewhat similarly to X-ray image intensifiers in that scintillators (e.g., sodium iodide) absorb X-ray and emit visible light, which can then be detected by a suitable image sensor for visible light. In scintillators, the visible light spreads and scatters in all directions and thus reduces spatial resolution. Reducing the scintillator thickness helps to improve the spatial resolution but also reduces absorption of X-ray. A scintillator thus has to strike a compromise between absorption efficiency and resolution.

Semiconductor X-ray detectors largely overcome this problem by a direct conversion of X-ray into electric signals. A semiconductor X-ray detector may include a semiconductor layer that absorbs X-ray in wavelengths of interest. When an X-ray photon is absorbed in the semiconductor layer, multiple charge carriers (e.g., electrons and holes) are generated and swept under an electric field towards electrical contacts on the semiconductor layer. Cumbersome heat management required in currently available semiconductor X-ray detectors (e.g., Medipix) can make a detector with a large area and a large number of pixels difficult or impossible to produce.

SUMMARY

Disclosed herein is an apparatus suitable for detecting X-ray, the apparatus comprising: a first substrate comprising a plurality of first electric contacts; a first chip layer comprising a plurality of first chips, wherein each of the first chips comprises a first electrode and is bonded to the first substrate such that the first electrode is electrically connected to at least one of the first electrical contacts; a second substrate comprising a plurality of second electric contacts; and a second chip layer comprising a plurality of second chips, wherein each of the second chips comprises a second electrode and is bonded to the second substrate such that the second electrode is electrically connected to at least one of the second electrical contacts, wherein the first chip layer and the second chip layer are bonded to each other such that at least two second chips are bonded to a same first chip.

According to an embodiment, the first chip layer and the second chip layer are bonded using a conductive material.

According to an embodiment, the first chip layer and the second chip layer are sandwiched between the first substrate and the second substrate.

According to an embodiment, the at least two second chips and the same first chip are directly connected to a same electrode.

According to an embodiment, at least one of the first chip layer and the second chip layer is configured for absorbing X-ray.

According to an embodiment, at least one of the first substrate and the second substrate comprises an electronic system configured for processing signals generated by the absorbed X-ray.

According to an embodiment, the second substrate is thinner than the first substrate.

According to an embodiment, the first chip layer and the second chip layer comprise silicon, germanium, GaAs, CdTe, CdZnTe, or a combination thereof.

Disclosed herein is a method for making an apparatus suitable for detecting X-ray, the method comprising: bonding a plurality of first chips to a first substrate to form a first chip layer, wherein the first substrate comprises a plurality of first electric contacts, wherein each of the first chips comprises a first electrode, and wherein the plurality of first chips are bonded to the first substrate such that each first electrode is electrically connected to at least one of the first electrical contacts; bonding a plurality of second chips to a second substrate to form a second chip layer, wherein the second substrate comprises a plurality of second electric contacts, wherein each of the second chips comprises a second electrode, and wherein the plurality of second chips are bonded to the second substrate such that each second electrode is electrically connected to at least one of the second electrical contacts; and bonding the first chip layer and the second chip layer to each other such that at least two second chips are bonded to a same first chip.

According to an embodiment, the first chip layer and the second chip layer are bonded using a conductive material.

According to an embodiment, the first chip layer and the second chip layer are sandwiched between the first substrate and the second substrate in the apparatus.

According to an embodiment, the at least two second chips and the same first chip are directly connected to a same electrode.

According to an embodiment, at least one of the first chip layer and the second chip layer is configured for absorbing X-ray.

According to an embodiment, at least one of the first substrate and the second substrate comprises an electronic system configured for processing signals generated by the absorbed X-ray.

According to an embodiment, the second substrate is thinner than the first substrate.

Disclosed herein is a method for making an apparatus suitable for detecting X-ray, the method comprising: bonding a plurality of chips to a substrate, wherein the substrate comprises a plurality of electric contacts, wherein each of the chips comprises an X-ray absorption layer comprising an electrode, and wherein the plurality of chips are bonded to the substrate such that each electrode is electrically connected to at least one of the electrical contacts; and electrically connecting the plurality of chips by a material on top side of the chips.

According to an embodiment, the material is not in form of a wafer.

According to an embodiment, the chips are electrically connected by electrical wires or conductive tapes.

According to an embodiment, electrically connecting the plurality of chips comprises sputtering a metal layer on top of the plurality of chips.

According to an embodiment, electrically connecting the plurality of chips further comprises filling gaps between the chips with insulating material or covering the gaps between the chips with insulating tapes.

Disclosed herein is a method for making an apparatus suitable for detecting X-ray, the method comprising bonding a plurality of chips to a substrate having a first surface and a second surface, wherein: each of the chips comprises an X-ray absorption layer comprising an electrode; the substrate comprises electronics comprising a plurality of electric contacts; the plurality of chips are bonded to the substrate such that each electrode is electrically connected to at least one of the electrical contacts, and the second surface is free of the electronics.

According to an embodiment, the method further comprises thinning the substrate from the second surface.

According to an embodiment, the electronics include electrical wires each of which electrically connects at least some of the electrical contacts.

According to an embodiment, signals from the electric contacts can be read out via the electrical wires.

According to an embodiment, each of the electrical wires extends across multiple dies that are connected on the first surface during exposure.

According to an embodiment, the multiple dies are connected along a first direction.

According to an embodiment, a test pattern is placed in a gap between two dies along a second direction during exposure.

According to an embodiment, one end of each of the electrical wires is shifted relative to the other end by an integer multiple of a pitch of the electrical wires.

According to an embodiment, the electronics include an electronics system, the electronics system comprising: a first voltage comparator configured to compare a voltage of the electrode to a first threshold; a second voltage comparator configured to compare the voltage to a second threshold; a counter configured to register a number of X-ray photons reaching the X-ray absorption layer; a controller; wherein the controller is configured to start a time delay from a time at which the first voltage comparator determines that an absolute value of the voltage equals or exceeds an absolute value of the first threshold; wherein the controller is configured to activate the second voltage comparator during the time delay; wherein the controller is configured to cause the number registered by the counter to increase by one, if the second voltage comparator determines that an absolute value of the voltage equals or exceeds an absolute value of the second threshold.

BRIEF DESCRIPTION OF FIGURES

FIG. 4B schematically shows flip chip bonding between an X-ray absorption layer and an electronic layer, according to an embodiment of the present teaching.

FIG. 5B schematically shows a semiconductor X-ray detector having multiple chips bonded to the substrate and electrically connected by conductive tapes, according to an embodiment of the present teaching.

FIG. 6B schematically shows a semiconductor X-ray detector having multiple chips bonded to the substrate and electrically connected by a metal layer, according to another embodiment of the present teaching.

DETAILED DESCRIPTION

Figure 1A:
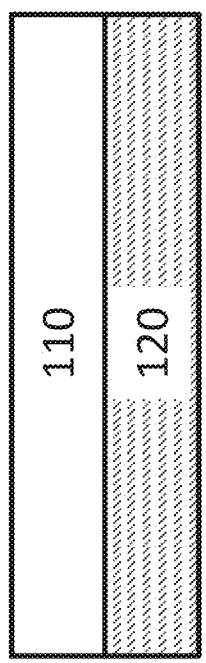
FIG. 1A schematically shows a cross-sectional view of a detector, according to an embodiment of the present teaching.

FIG. 1A schematically shows a semiconductor X-ray detector 100, according to an embodiment. The semiconductor X-ray detector 100 may include an X-ray absorption layer 110 and an electronics layer 120 (e.g., an ASIC) for processing or analyzing electrical signals incident X-ray generates in the X-ray absorption layer 110. In an embodiment, the semiconductor X-ray detector 100 does not comprise a scintillator. The X-ray absorption layer 110 may include a semiconductor material such as, silicon, germanium, GaAs, CdTe, CdZnTe, or a combination thereof. The semiconductor may have a high mass attenuation coefficient for the X-ray energy of interest.

Figure 1B:
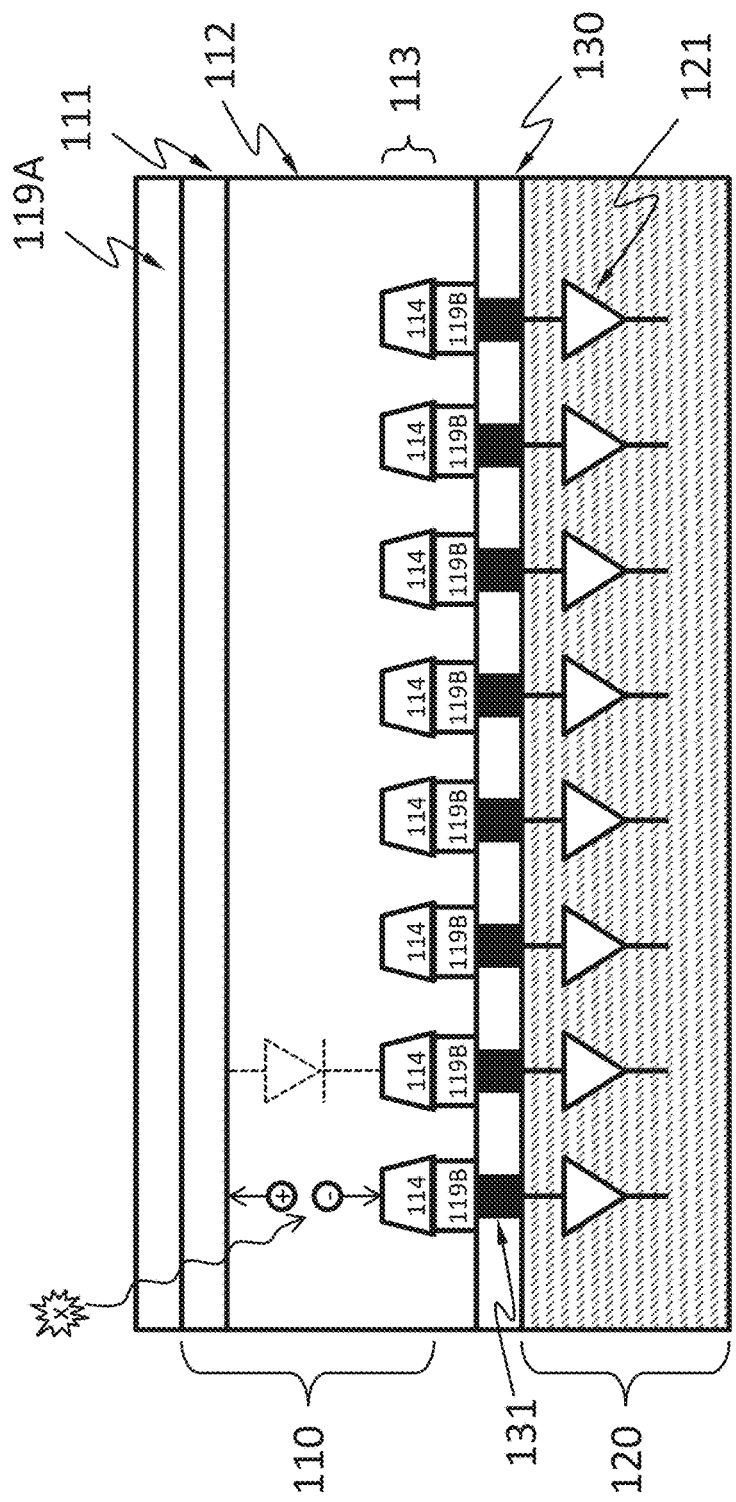
FIG. 1B schematically shows a detailed cross-sectional view of the detector, according to an embodiment of the present teaching.

As shown in a detailed cross-sectional view of the detector 100 in FIG. 1B, according to an embodiment, the X-ray absorption layer 110 may include one or more diodes (e.g., p-i-n or p-n) formed by a first doped region 111, one or more discrete regions 114 of a second doped region 113. The second doped region 113 may be separated from the first doped region 111 by an optional the intrinsic region 112. The discrete portions 114 are separated from one another by the first doped region 111 or the intrinsic region 112. The first doped region 111 and the second doped region 113 have opposite types of doping (e.g., region 111 is p-type and region 113 is n-type, or region 111 is n-type and region 113 is p-type). In the example in FIG. 1B, each of the discrete regions 114 of the second doped region 113 forms a diode with the first doped region 111 and the optional intrinsic region 112. Namely, in the example in FIG. 1B, the X-ray absorption layer 110 has a plurality of diodes having the first doped region 111 as a shared electrode. The first doped region 111 may also have discrete portions.

When an X-ray photon hits the X-ray absorption layer 110 including diodes, the X-ray photon may be absorbed and generate one or more charge carriers by a number of mechanisms. The charge carriers may drift to the electrodes of one of the diodes under an electric field. The field may be an external electric field. The electrical contact 119B may include discrete portions each of which is in electrical contact with the discrete regions 114.

Figure 1C:
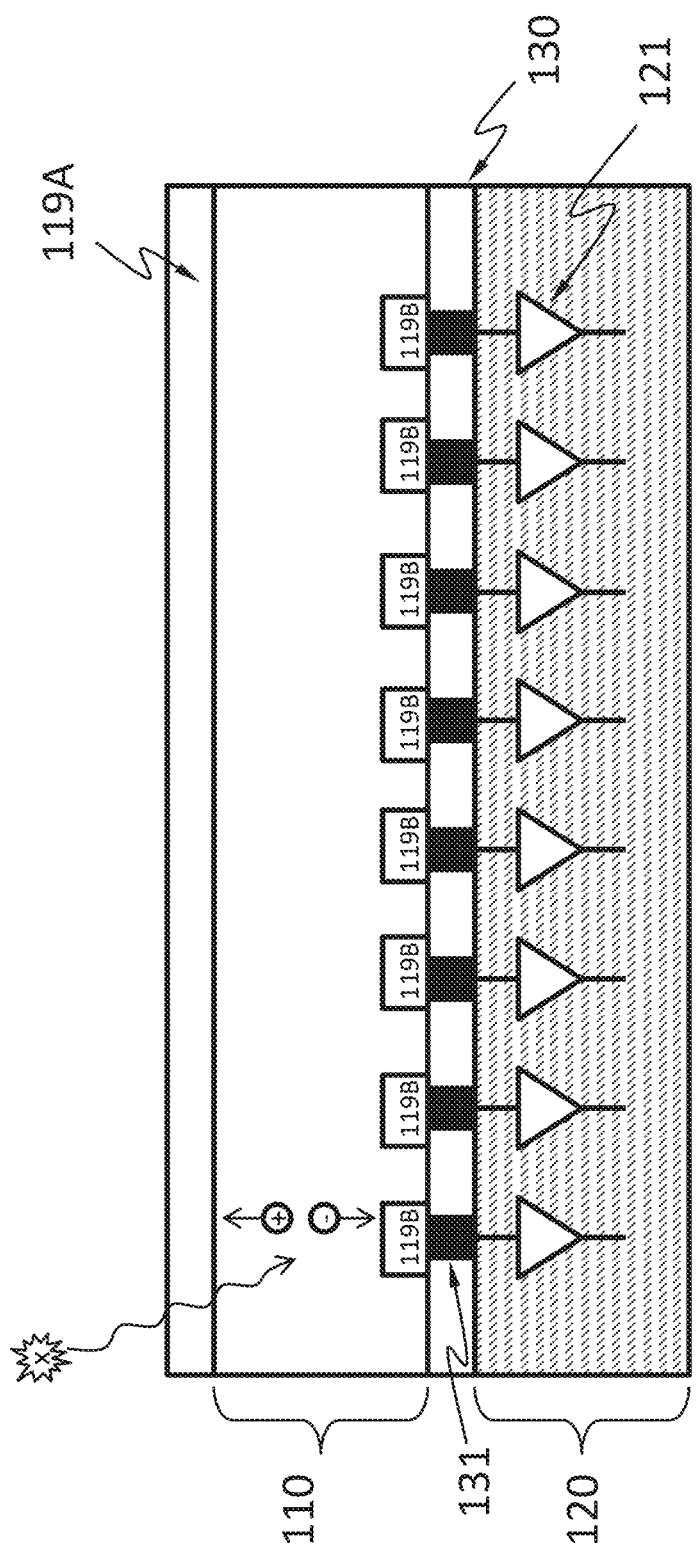
FIG. 1C schematically shows an alternative detailed cross-sectional view of the detector, according to an embodiment of the present teaching.

As shown in an alternative detailed cross-sectional view of the detector 100 in FIG. 1C, according to an embodiment, the X-ray absorption layer 110 may include a resistor of a semiconductor material such as, silicon, germanium, GaAs, CdTe, CdZnTe, or a combination thereof, but does not include a diode.

When an X-ray photon hits the X-ray absorption layer 110 including a resistor but not diodes, it may be absorbed and generate one or more charge carriers by a number of mechanisms. The charge carriers may drift to the electrical contacts 119A and 119B under an electric field. The electrical contact 119B includes discrete portions.

The electronics layer 120 may include an electronic system 121 suitable for processing or interpreting signals generated by X-ray photons incident on the X-ray absorption layer 110. The electronic system 121 may include an analog circuitry such as a filter network, amplifiers, integrators, and comparators, or a digital circuitry such as a microprocessors, and memory. The electronic system 121 may include components shared by the pixels or components dedicated to a single pixel. For example, the electronic system 121 may include an amplifier dedicated to each pixel and a microprocessor shared among all the pixels. The electronic system 121 may be electrically connected to the pixels by vias 131. Space among the vias may be filled with a filler material 130, which may increase the mechanical stability of the connection of the electronics layer 120 to the X-ray absorption layer 110. Other bonding techniques are possible to connect the electronic system 121 to the pixels without using vias.

Figure 1D:
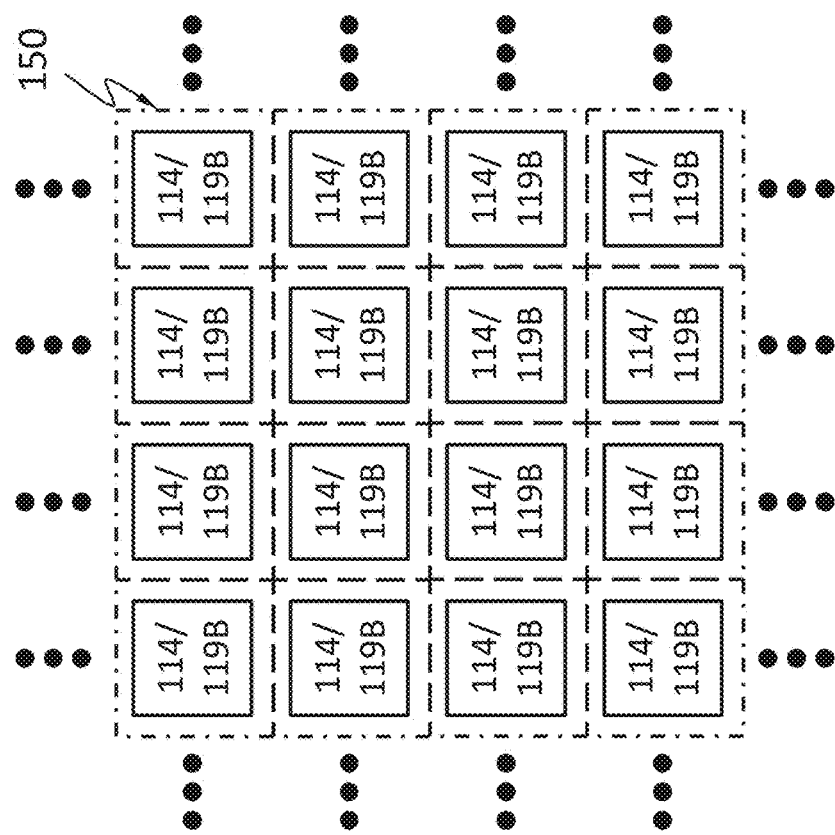
FIG. 1D shows an exemplary top view of a portion of the detector, according to an embodiment of the present teaching.

FIG. 1D shows an exemplary top view of a portion of the semiconductor X-ray detector 100 with a 4-by-4 array of discrete regions 114/119B. Charge carriers generated by an X-ray photon incident around the footprint of one of these discrete regions 114/119B are not substantially shared with another of these discrete regions 114/119B. The area 150 around a discrete region 114/119B in which substantially all (more than 95%, more than 98% or more than 99% of) charge carriers generated by an X-ray photon incident therein flow to the discrete region 114/119B is called a pixel associated with that discrete region 114/119B. Namely, less than 5%, less than 2% or less than 1% of these charge carriers flow beyond the pixel, when the X-ray photon hits inside the pixel. By measuring the rate of change of the voltage of each of the discrete regions 114/119B, the number of X-ray photons absorbed (which relates to the incident X-ray intensity) and/or the energies thereof in the pixels associated with the discrete regions 114/119B may be determined. Thus, the spatial distribution (e.g., an image) of incident X-ray intensity may be determined by individually measuring the rate of change of the voltage of each one of an array of discrete regions 114/119B. The pixels may be organized in any suitable array, such as, a square array, a triangular array and a honeycomb array. The pixels may have any suitable shape, such as, circular, triangular, square, rectangular, and hexangular. The pixels may be individually addressable.

Figure 2:
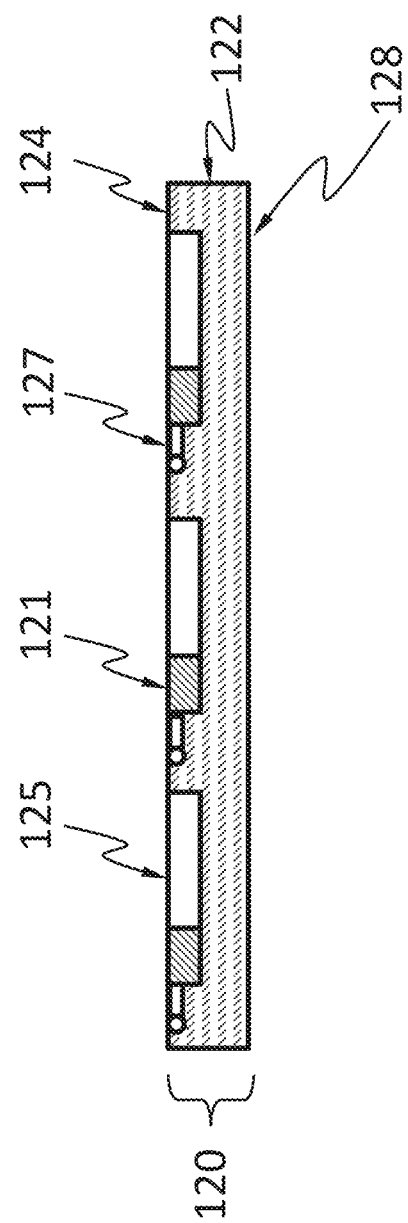
FIG. 2 schematically shows a cross-sectional view of an electronics layer in the detector, according to an embodiment of the present teaching.

FIG. 2 schematically shows a cross-sectional view of an electronics layer 120 in the detector, according to an embodiment of the present teaching. In this example, the electronic layer 120 comprises a substrate 122 having a first surface 124 and a second surface 128. A "surface" as used herein is not necessarily exposed, but can be buried wholly or partially. The electronic layer 120 comprises one or more electric contacts 125 on the first surface 124. The one or more electric contacts 125 may be configured to be electrically connected to one or more electrodes of the X-ray absorption layer 110. The electronics system 121 may be in or on the substrate 122, and electrically connected to the electric contacts 125.

The electronic layer 120 comprises one or more transmission lines 127 electrically connected to the electronics system 121. The transmission line 127 may be a metal wire on the first surface 124, such that data processed by the electronics system 121 may be read out via the transmission line 127. The transmission line 127 may also be used for control, providing power or input to the electronics system 121.

As shown in FIG. 2, there is no electrical component on the second surface 128, i.e. the bottom side of the substrate 122 does not have electrical components. Therefore, the substrate 122 can be thinned (e.g., by grinding the second surface 128). For example, the substrate may have a thickness of 750 microns or less, 200 microns or less, 100 microns or less, 50 microns or less, 20 microns or less, or 5 microns or less. The substrate 122 may be a silicon substrate or a substrate or other suitable semiconductor or insulator. The substrate 122 may be produced by grinding a thicker substrate to a desired thickness.

The one or more electric contacts 125 may be a layer of metal or doped semiconductor. For example, the electric contacts 125 may be gold, copper, platinum, palladium, doped silicon, etc.

The transmission lines 127 electrically connect electrical components (e.g., the electronics system 121) in the substrate 122 to bonding pads at other locations on the substrate 122. In one embodiment, each transmission lines 127 may be electrically connected to the electronics system 121 through a via. The transmission lines 127 may be electrically isolated from the substrate 122 except at certain vias and certain bonding pads. The transmission lines 127 may be a material (e.g., Al) with small mass attenuation coefficient for the X-ray energy of interest. The transmission lines 127 may redistribute electrical connections to more convenient locations.

Figure 3A:
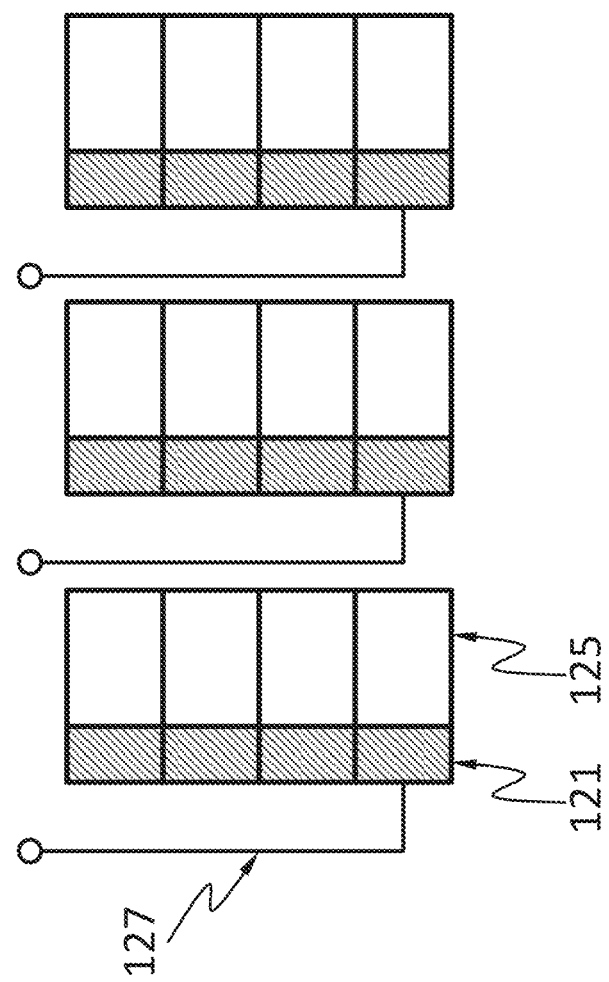
FIG. 3A shows an exemplary top view of the electronics layer, according to an embodiment of the present teaching.

FIG. 3A shows an exemplary top view of the electronics layer, according to an embodiment of the present teaching. As shown in FIG. 3A, the electric contacts 125 and the electronics system 121 in a group of different pixels may share a transmission line 127. For example, signals of the group of pixels may be read out sequentially.

Figure 3B:
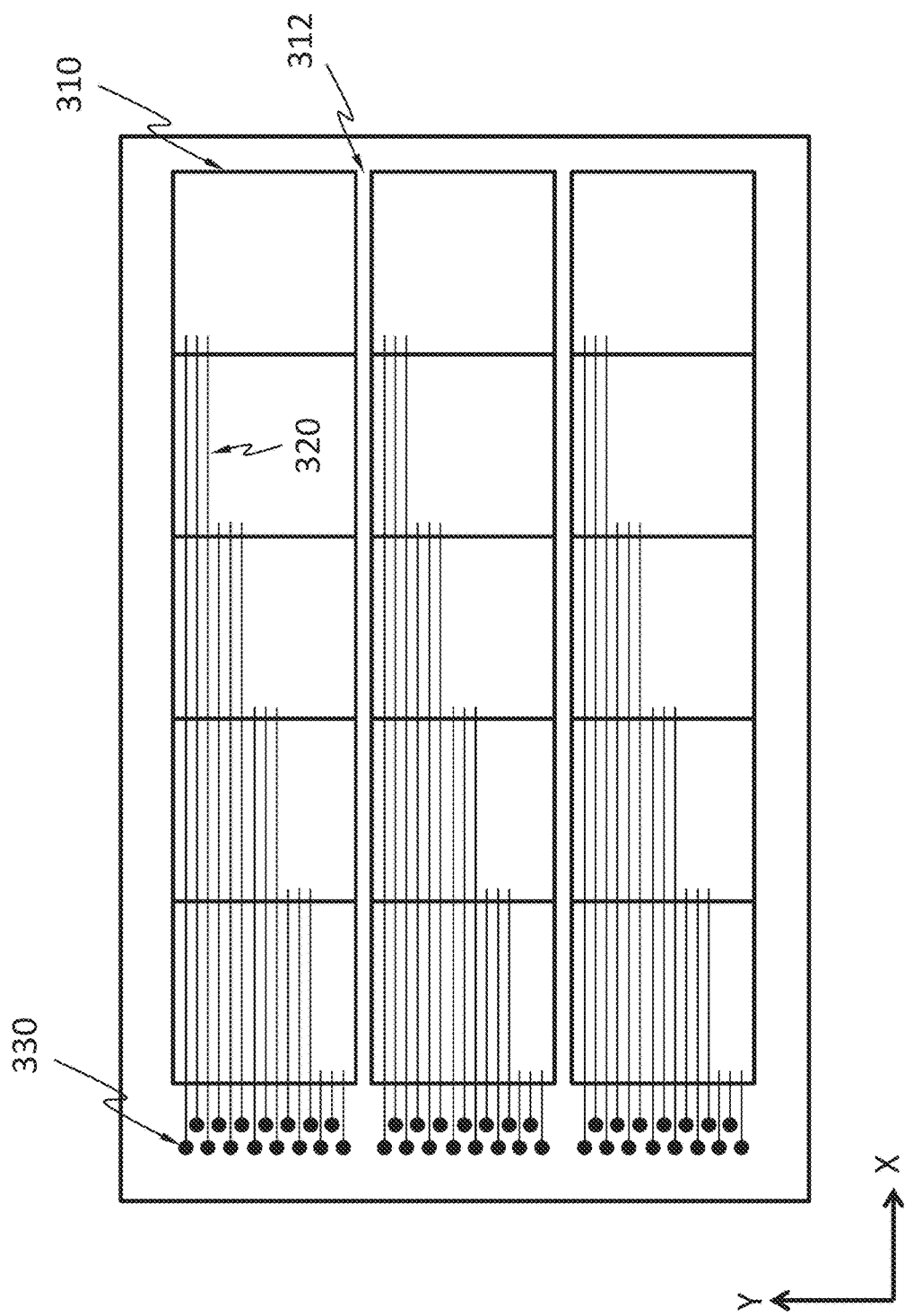
FIG. 3B shows an exemplary top view of the electronics layer, according to an embodiment of the present teaching.

FIG. 3B shows an exemplary top view of the electronics layer, according to an embodiment of the present teaching. As shown in FIG. 3B, the wafer is divided into different regions (dies). A die 310 may correspond to one or more pixels after production. The dies 310 may be connected along one direction (e.g. X direction as shown in FIG. 3B) without any gap, such that wires 320 in the pixels corresponding to the dies can extend across multiple dies and hence electrically connect the pixels for signal readout. As shown in FIG. 3B, since there is no gap between dies 310 along the Y direction, each of the wires 320 can extend across multiple dies along the X direction to a metal pad 330 disposed near the edge of the substrate. It can be understood by one skilled in the art that the dies 310 may also be connected along the other direction (Y direction in FIG. 3B). In one embodiment, test patterns may be placed in gaps 312 between two lines of connected dies for lithography purposes, e.g. to serve as alignment markers.

In this manner, signals can be read out from the electronics layer 120 without need of a redistribution layer (RDL) in the electronics layer 120 or through-silicon via (TSV) through the electronics layer 120. As such, the electronics layer 120 may be further thinned to a certain level within the scope of mechanical stability. This may help to improve detection quantum efficiency (DQE) of the detector by reducing X-ray absorption of the electronics layer 120, especially when multiple layers of the X-ray detector 100 are stacked.

Figure 3C:
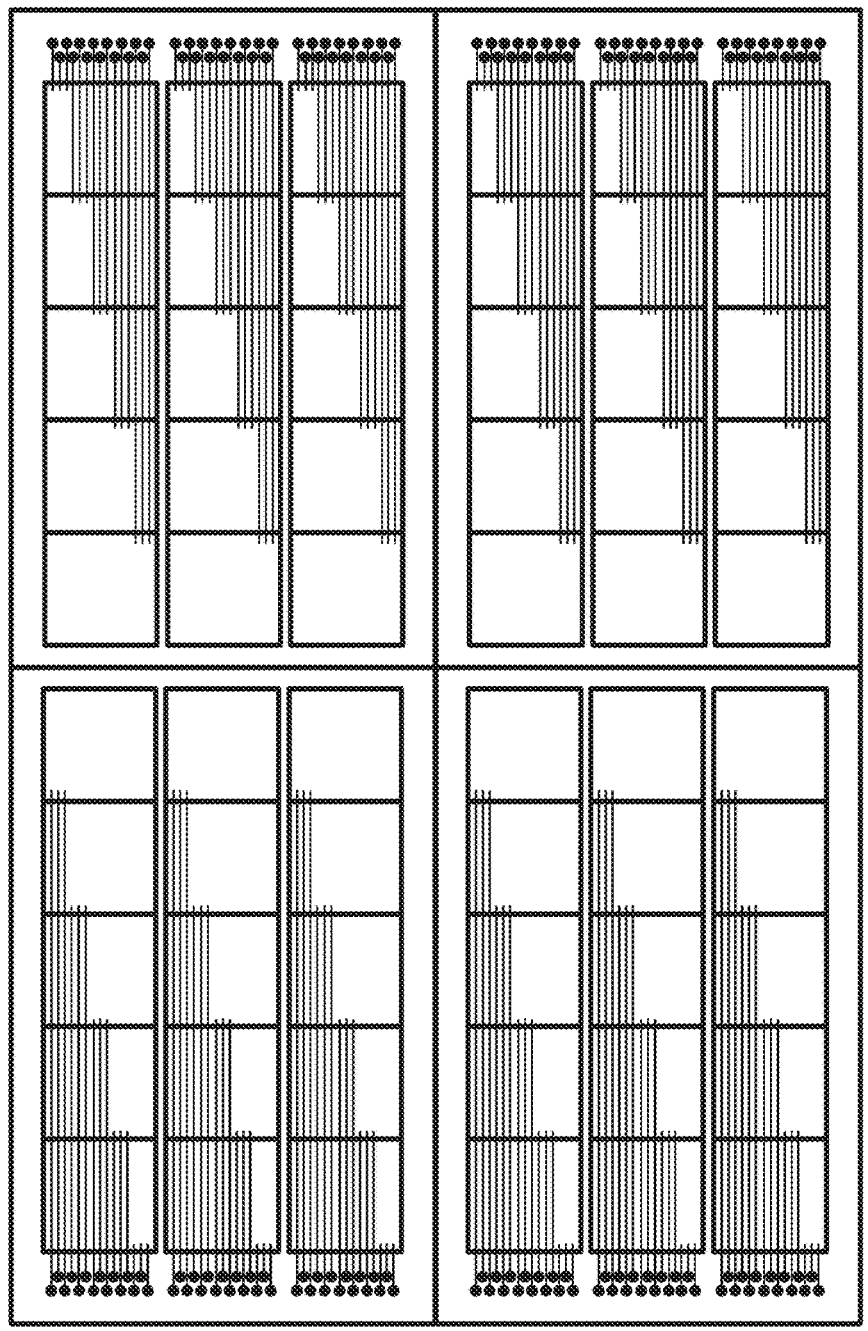
FIG. 3C shows that multiple wafers carrying the electronics layer may be connected together to form a large detector.
Figure 3D:
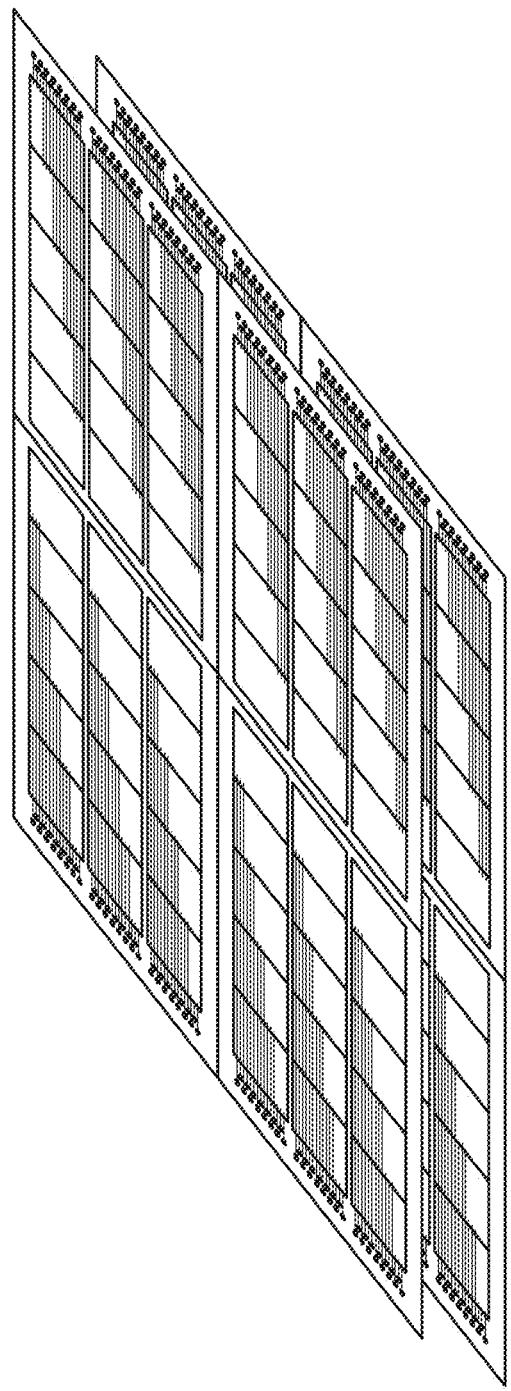
FIG. 3D shows that multiple large detectors may be stacked.

FIG. 3C shows that multiple wafers carrying the electronics layer 120 may be connected together to form a large detector, with all the pads still at the edge of the large detector. FIG. 3D shows that multiple large detectors may be stacked, with the boundaries offset from one another.

Figure 3E:
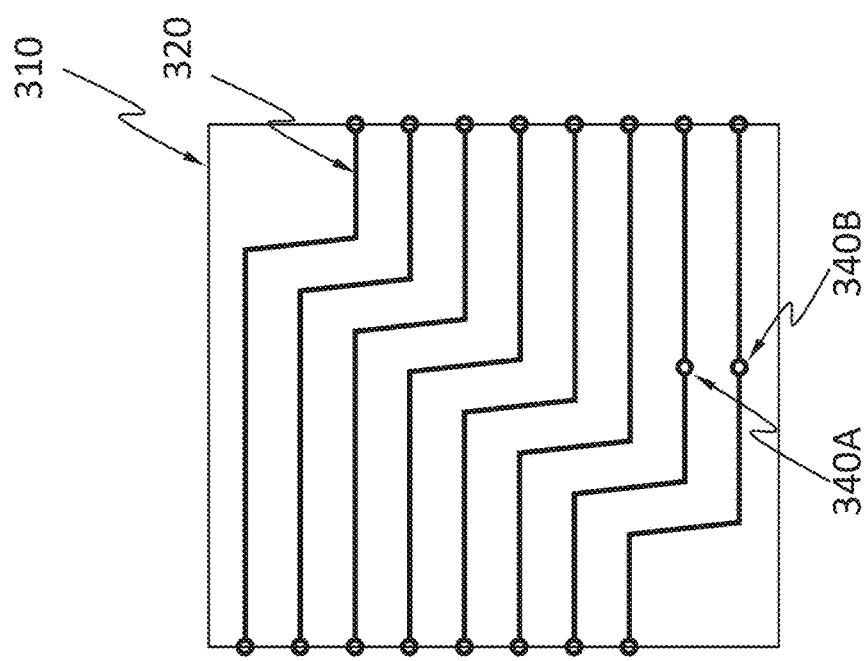
FIG. 3E shows an example of the layout of the wires in each die for signal readout from the pixels in the dies.
Figure 3F:
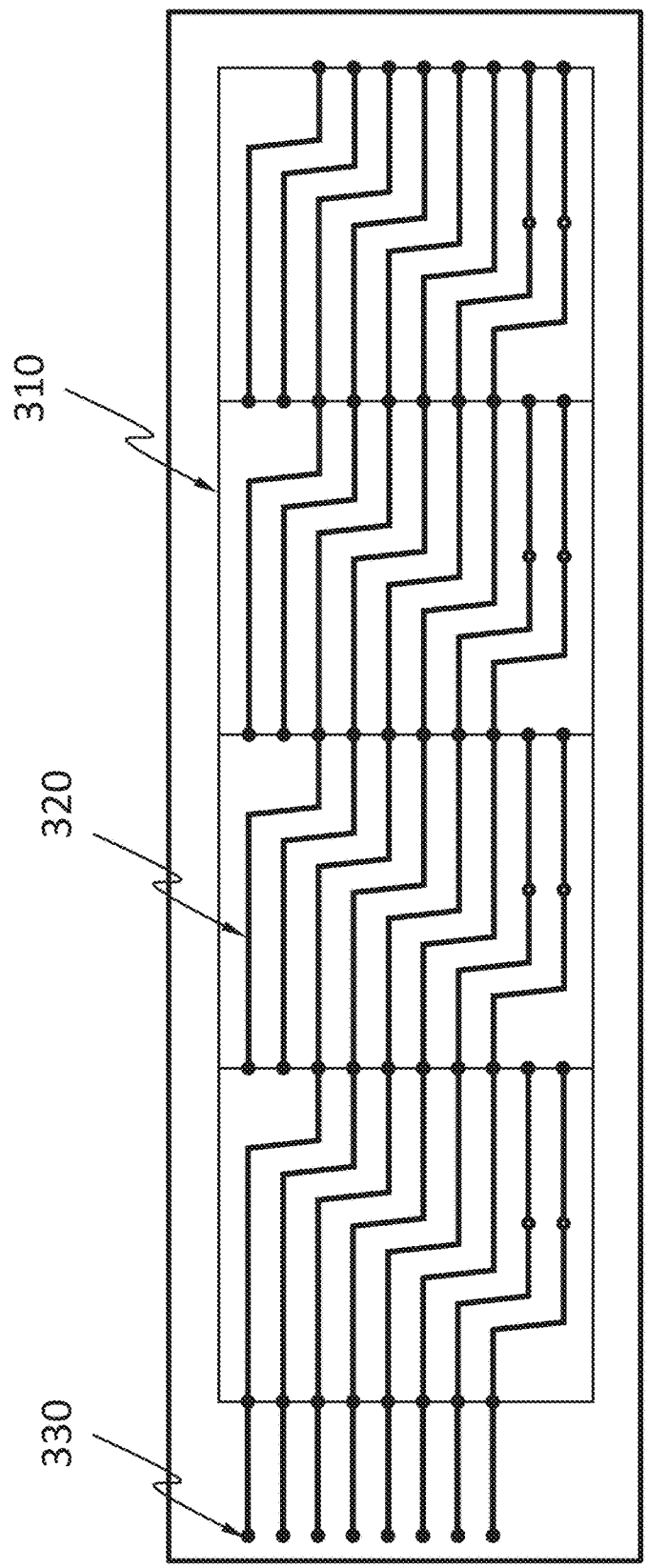
FIG. 3F shows the interconnection of the wires with the layout of FIG. 3E across multiple dies.

FIG. 3E shows an example of the layout of the wires 320 in each die 310. This layout can be the same in all of the ties and have interconnection across multiple dies to metal pads 330 disposed near the edge of the substrate. The pixels may be connected to the wires 320 at locations such as 340A and 340B. FIG. 3F shows the interconnection of the wires 320 in the dies 310. One end of each of the wires 320 is shifted relative to the other end by an integer multiple of the pitch of the wires.

Figure 4A:
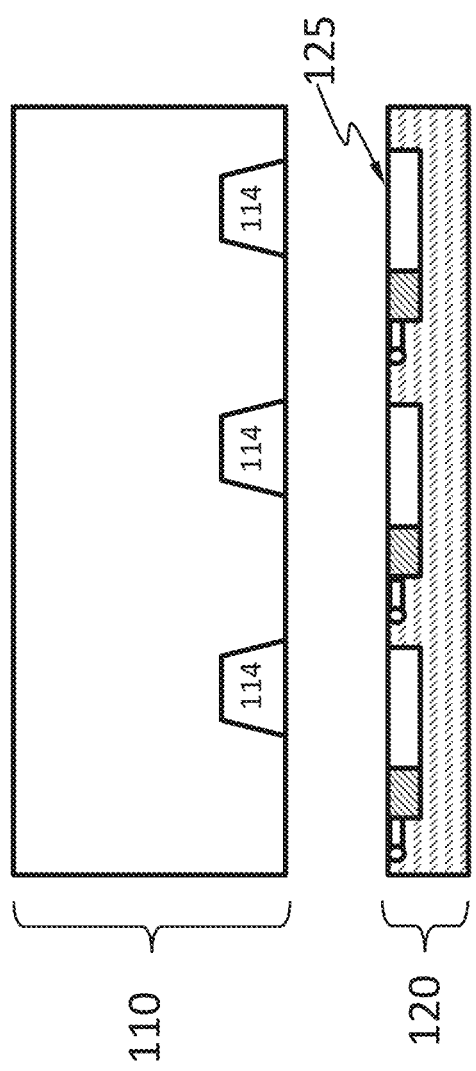
FIG. 4A schematically shows direct bonding between an X-ray absorption layer and an electronic layer, according to an embodiment of the present teaching.

FIG. 4A schematically shows direct bonding between the X-ray absorption layer 110 and the electronic layer 120 at electrodes such as the discrete regions 114 and the electrical contacts 125. Direct bonding is a wafer bonding process without any additional intermediate layers (e.g., solder bumps). The bonding process is based on chemical bonds between two surfaces. Direct bonding may be at elevated temperature but not necessarily so.

FIG. 4B schematically shows flip chip bonding between the X-ray absorption layer 110 and the electronic layer 120 at electrodes such as the discrete regions 114 and the electrical contacts 125. Flip chip bonding uses solder bumps 199 deposited onto contact pads (e.g., the electrodes of the X-ray absorption layer 110 or the electrical contacts 125). Either the X-ray absorption layer 110 or the electronic layer 120 is flipped over and the electrodes of the X-ray absorption layer 110 are aligned to the electrical contacts 125. The solder bumps 199 may be melted to solder the electrodes and the electrical contacts 125 together. Any void space among the solder bumps 199 may be filled with an insulating material.

Figure 4C:
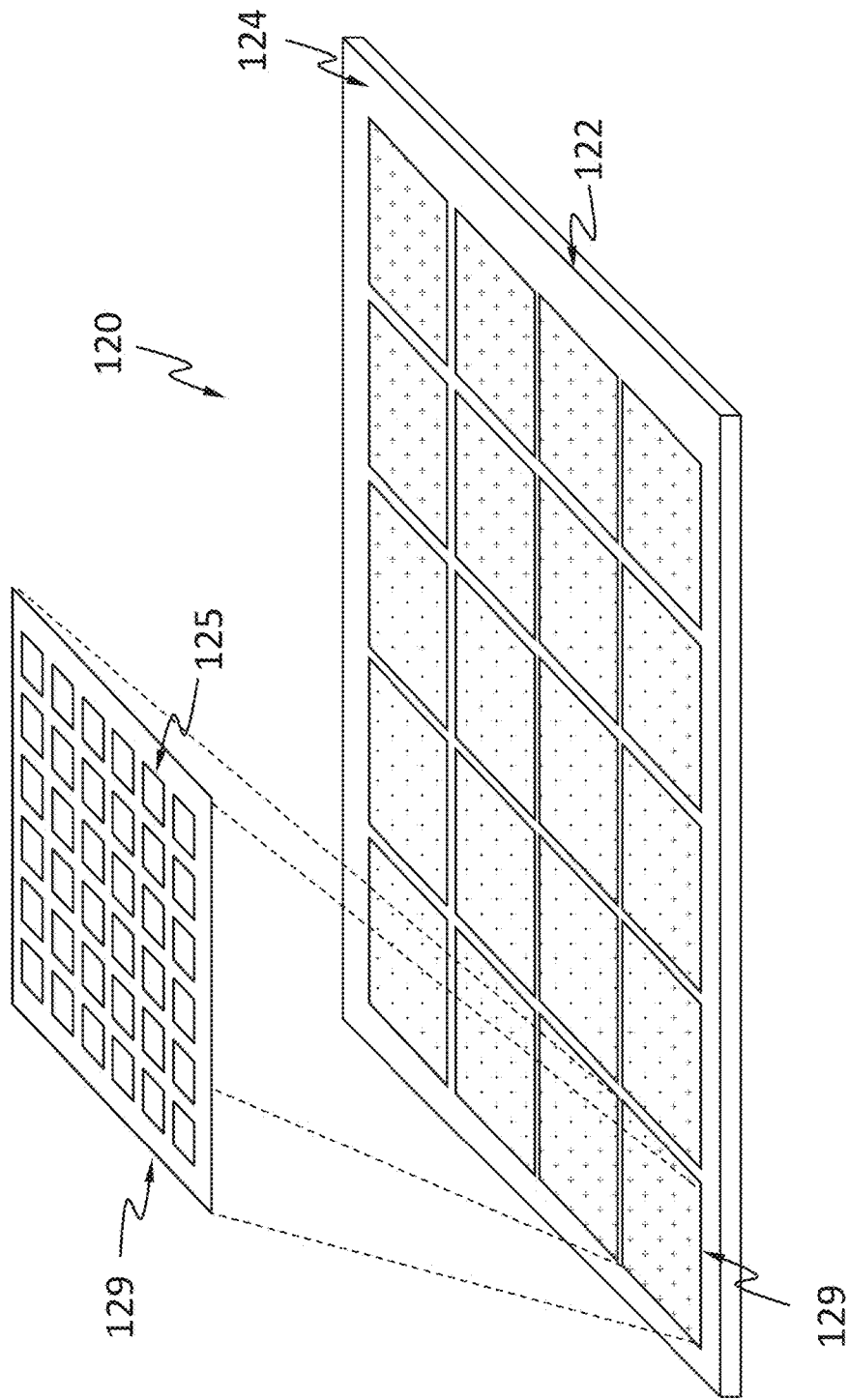
FIG. 4C schematically shows the electronic layer according to an embodiment of the present teaching.

FIG. 4C schematically shows the electronic layer 120 according to an embodiment of the present teaching. The substrate 122 of the electronic layer 120 has multiple electric contacts 125 on the first surface 124. The multiple electric contacts 125 may be organized into multiple regions 129. The electronics system 121 may be in or on the substrate 122.

Figure 4D:
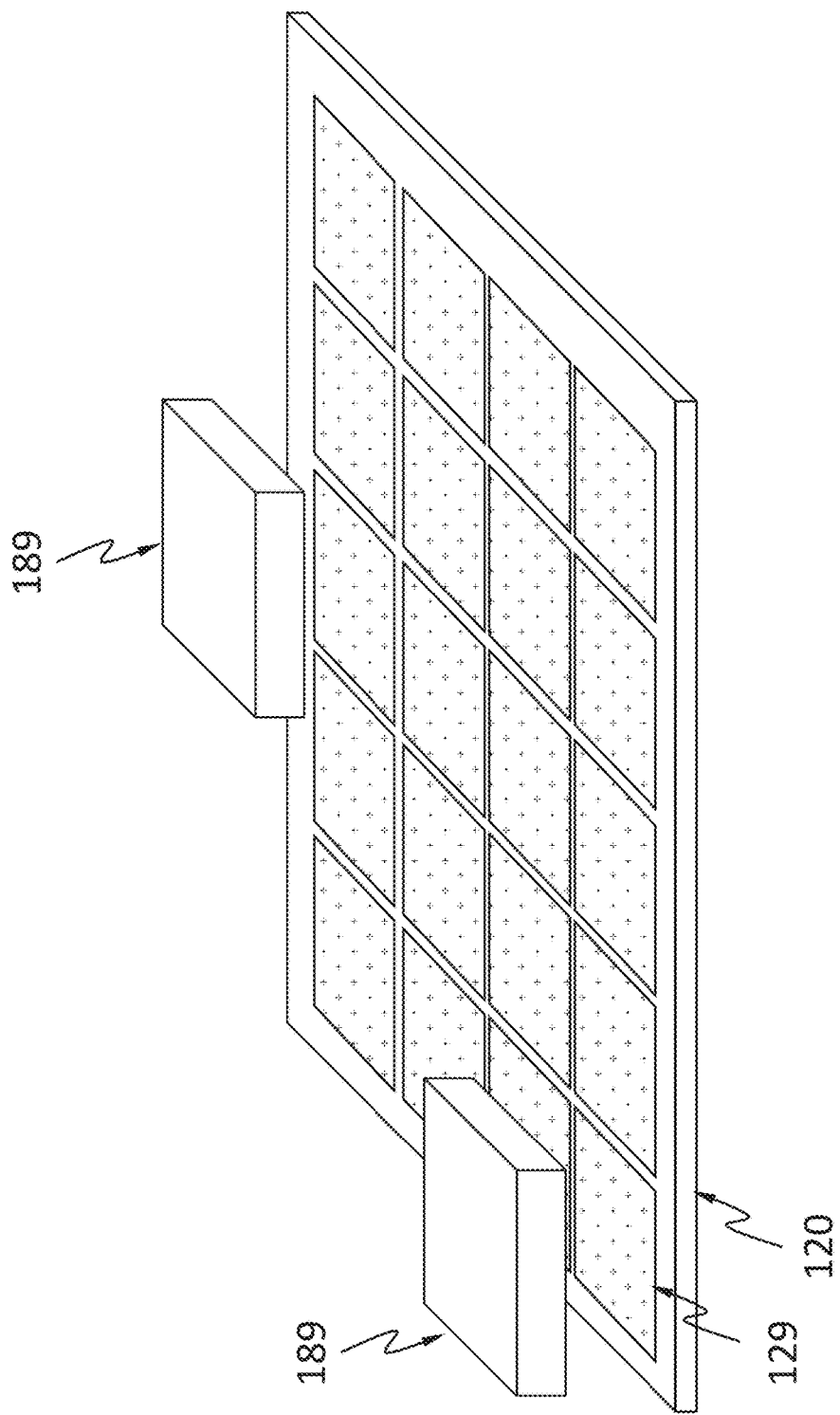
FIG. 4D schematically shows that multiple chips may be obtained and aligned to the electronic layer 120.

FIG. 4D schematically shows that multiple chips 189 may be obtained and aligned to the regions 129 of the electronic layer 120. Each of the chips 189 includes an X-ray absorption layer such as the X-ray absorption layer 110 shown in FIG. 1A, FIG. 1B, FIG. 1C, FIG. 4A or FIG. 4B. The X-ray absorption layer in each of the chips 189 has an electrode.

Figure 4E:
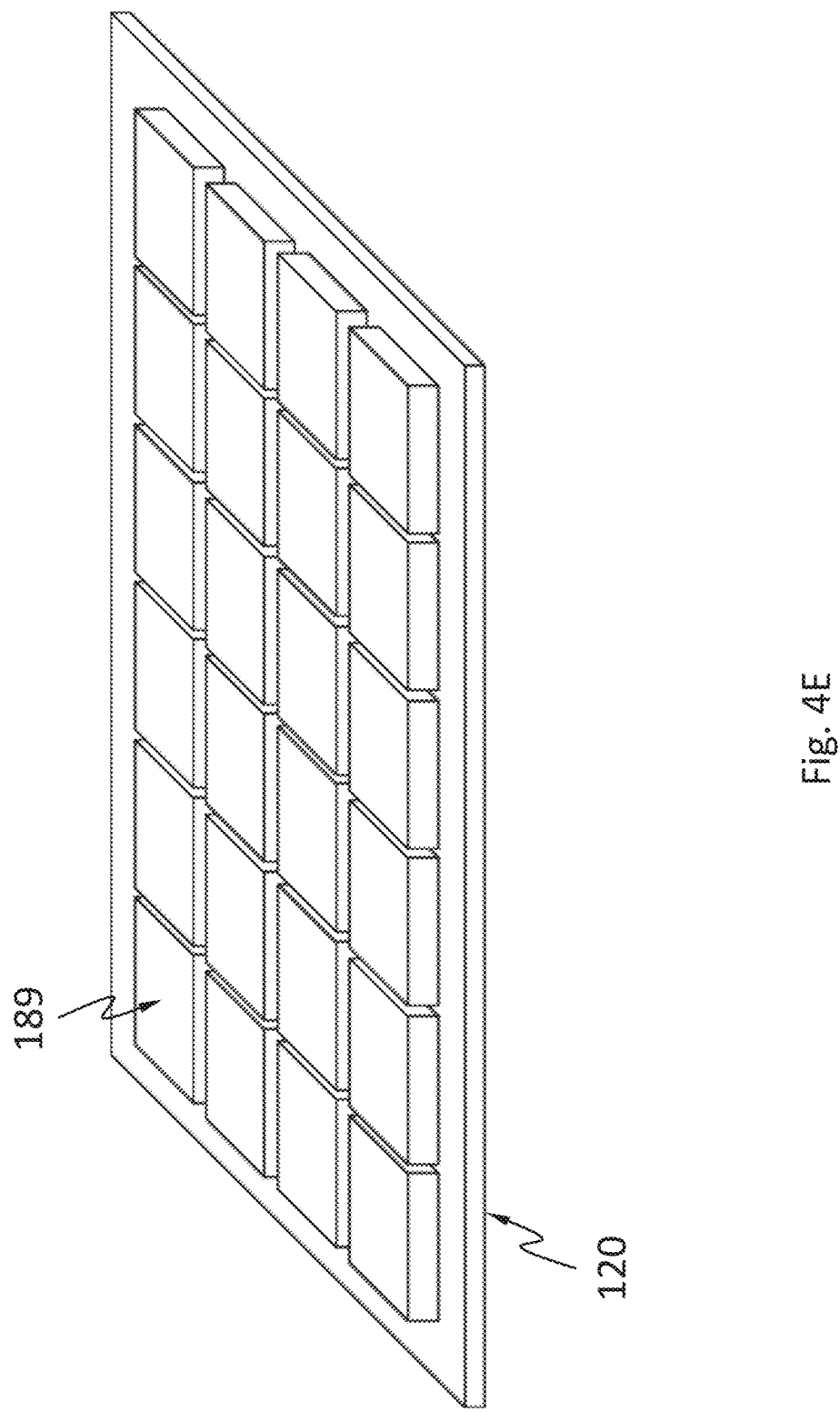
FIG. 4E shows that the chips may be bonded to the substrate of the electronic layer.

FIG. 4E shows that the chips 189 may be bonded to the substrate 122 using a suitable bonding method such as flip chip bonding or directing bonding as shown in FIG. 4A and FIG. 4B. In an embodiment, each of the chips 189 is bonded to one of the areas 129. The electrode of each of the chips 189 is electrically connected to at least one of the electrical contacts 125. The gap between two neighboring chips 189, after the chips 189 are bonded to the substrate 122, may be 100 microns or less. The chips 189 may be smaller in area than the substrate 122. The chips 189 may be arranged as an array after being bonded to the substrate 122. The smaller sizes of the chips 189 relative to the substrate 122 may help accommodating the difference in thermal expansion coefficients of the chips 189 and the substrate 122. A ratio between the thermal expansion coefficient of the chips 189 and the thermal expansion coefficient of the substrate 122 may be two or more. The X-ray absorption layer in the chips 189 may be 750 microns thick or less, 200 microns thick or less, 100 microns thick or less or 50 microns thick or less. Smaller thickness of the X-ray absorption layer reduces the chance that the charge carriers are trapped by defects in the X-ray absorption layer and thus increases the charge collection efficiency (CCE) by the electronic system 121 and the detection quantum efficiency (DQE) of the detector 100. The X-ray absorption layer in the chips 189 may be a material doped with chromium, especially when the material is GaAs. Chromium doping in GaAs may reduce the concentration of EL2 defects in GaAs and thus allows higher thickness of the X-ray absorption layer (thus higher absorption efficiency) without losing too many charge carriers to defects.

Figure 5A:
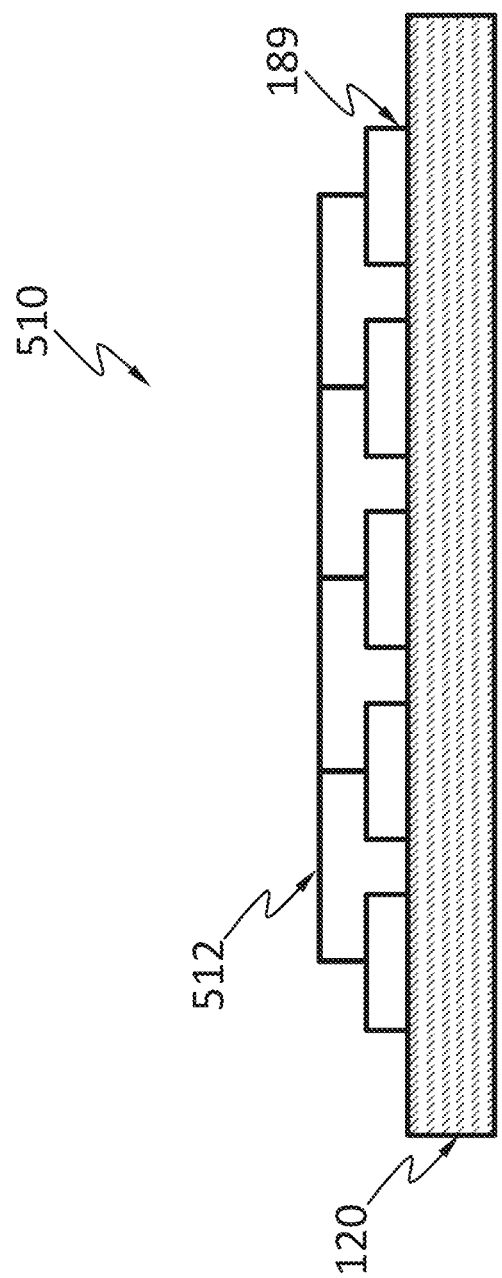
FIG. 5A schematically shows a semiconductor X-ray detector having multiple chips bonded to the substrate and electrically connected by electrical wires, according to an embodiment of the present teaching.

FIG. 5A schematically shows a semiconductor X-ray detector 510 having multiple chips bonded to the substrate and electrically connected by electrically conductive wires, according to an embodiment of the present teaching. To bias the chips 189, the chips 189 in the X-ray absorption layer the layers of the chips 189) may be electrically connected by electrically conductive wires 512. As such, the chips 189 may be biased simultaneously, through the wires 512 on top of the X-ray absorption layer.

FIG. 5B schematically shows a semiconductor X-ray detector 520 having multiple chips bonded to the substrate and electrically connected by conductive tapes, according to an embodiment of the present teaching. As shown in FIG. 5B, the chips 189 in the X-ray absorption layer (i.e. the layers of the chips 189) are electrically connected by conductive tapes 522. As such, the chips 189 may be biased simultaneously, through the electrical connection via the conductive tapes 522 on top of the X-ray absorption layer.

According to an embodiment of the present teaching, the semiconductor X-ray detector 100 may be fabricated using a method including: bonding a plurality of chips to a substrate, wherein the first substrate comprises a plurality of electric contacts, wherein each of the chips comprises an X-ray absorption layer comprising an electrode, and wherein the plurality of chips are bonded to the substrate such that each electrode is electrically connected to at least one of the electrical contacts; and electrically connecting the plurality of chips by a material on top side of the chips, wherein the plurality of chips are electrically connected by electrical wires or conductive tapes.

Figure 6A:
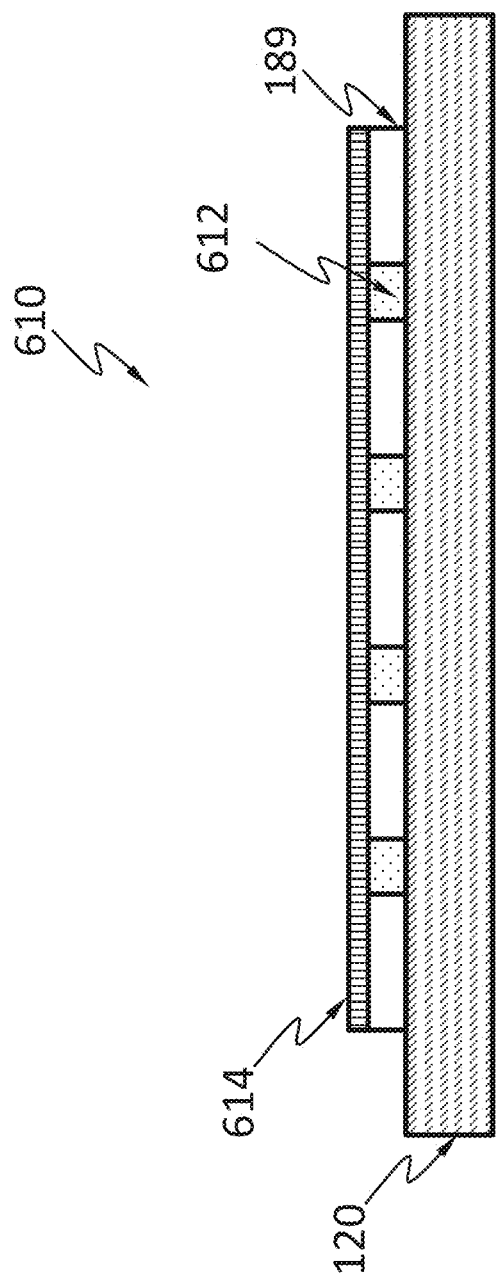
FIG. 6A schematically shows a semiconductor X-ray detector having multiple chips bonded to the substrate and electrically connected by a metal layer, according to an embodiment of the present teaching.

FIG. 6A schematically shows a semiconductor X-ray detector 610 having multiple chips bonded to the substrate and electrically connected by a metal layer, according to an embodiment of the present teaching. The semiconductor X-ray detector 610 comprises the electronics layer 120 and the chips 189, same as the semiconductor X-ray detector 100 shown in FIG. 4E. In addition, the semiconductor X-ray detector 610 also comprises insulating material 612 that is filled in the gaps between the chips 189. On top of the chips 189, the semiconductor X-ray detector 610 also includes a thin metal layer 614 that is sputtered onto the chips 189 and the insulating material 612. In this manner, the chips 189 can be electrically connected by the metal layer 614 to be biased without electrically conductive wires.

FIG. 6B schematically shows a semiconductor X-ray detector 620 having multiple chips bonded to the substrate and electrically connected by a metal layer, according to another embodiment of the present teaching. The semiconductor X-ray detector 620 comprises the electronics layer 120 and the chips 189, same as the semiconductor X-ray detector 100 shown in FIG. 4E. Instead of having insulating material 612 as in the semiconductor X-ray detector 610, the semiconductor X-ray detector 620 includes insulating tapes 622 covering the gaps between the chips 189. On top of the chips 189, the semiconductor X-ray detector 620 also includes a thin metal layer 624 that is sputtered onto the chips 189 and the insulating tapes 622. In this manner, the chips 189 can be electrically connected by the metal layer 624 to be biased without electrically conductive wires.

According to an embodiment of the present teaching, the semiconductor X-ray detector 600 may be fabricated using a method including: bonding a plurality of chips to a substrate, wherein the first substrate comprises a plurality of electric contacts, wherein each of the chips comprises an X-ray absorption layer comprising an electrode, and wherein the plurality of chips are bonded to the substrate such that each electrode is electrically connected to at least one of the electrical contacts; and electrically connecting the plurality of chips by a material on top side of the chips, wherein electrically connecting the plurality of chips comprises sputtering a metal layer on top of the plurality of chips.

Figure 7A:
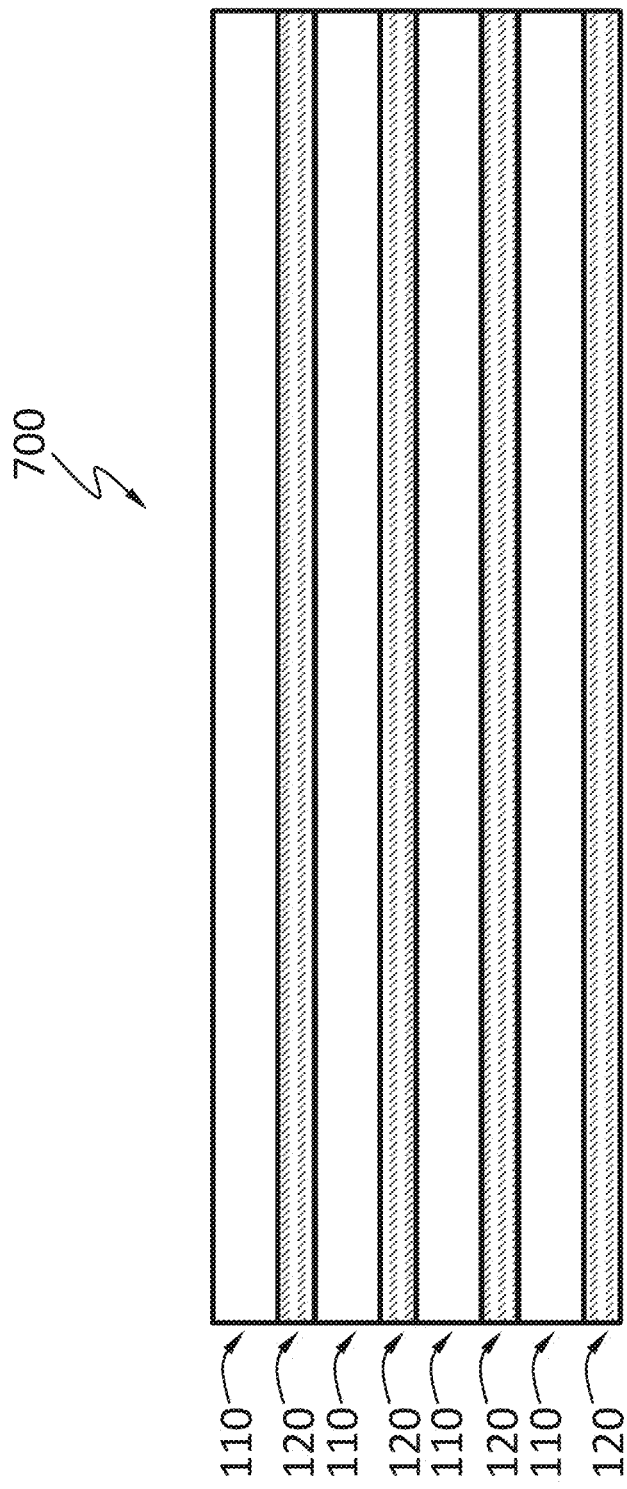
FIG. 7A shows that the electronics layer as shown in FIG. 2 allows stacking multiple semiconductor X-ray detectors, according to an embodiment of the present teaching.

FIG. 7A shows that the electronics layer 120 as shown in FIG. 2 allows stacking multiple semiconductor X-ray detectors 100 to form a new X-ray detector 700. In each electronics layer 120, the transmission lines 127 in FIG. 3A can facilitate routing of signals of all pixels to a side of the wafer for readout. The signals can be gathered for X-ray detection. The electronic system 121 as described below may have low enough power consumption to eliminate bulky cooling mechanisms, which also helps to enable the stacked structure in FIG. 7A. The multiple semiconductor X-ray detectors 100 in the stack do not have to be identical. For example, the multiple semiconductor X-ray detectors 100 may differ in thickness, structure, or material.

Figure 7B:
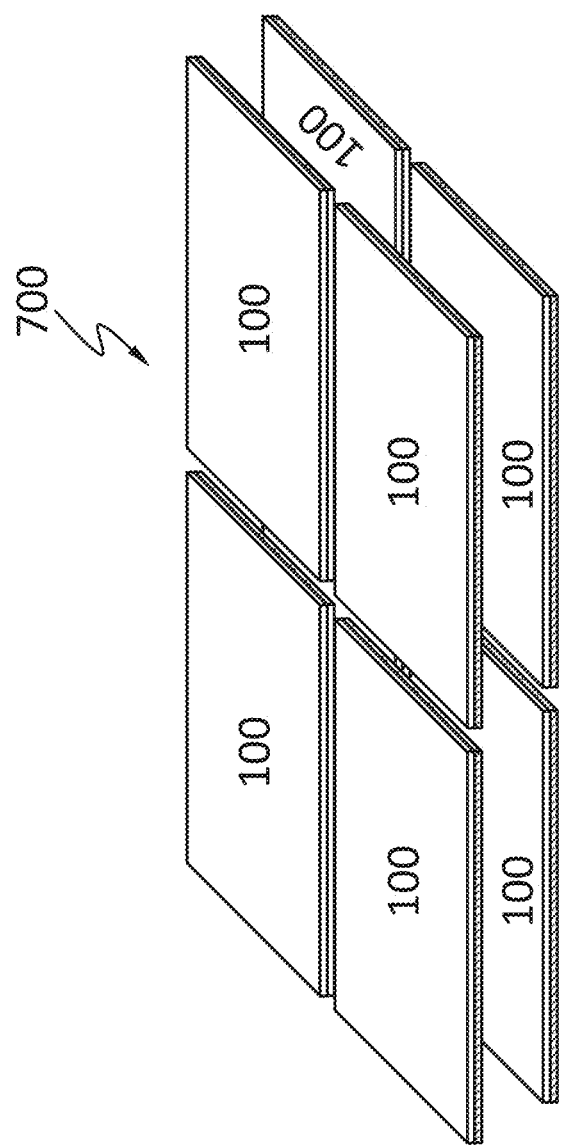
FIG. 7B schematically shows a top view of multiple semiconductor X-ray detectors 100 stacked, according to an embodiment of the present teaching.

FIG. 7B schematically shows a top view of multiple semiconductor X-ray detectors 100 stacked, according to an embodiment of the present teaching. Each layer may have multiple detectors 100 tiled to cover a larger area. The tiled detectors 100 in one layer can be staggered relative to the tiled detectors 100 in another layer, which may eliminate gaps in which incident X-ray photons cannot be detected.

According to an embodiment of the present teaching, multiple semiconductor X-ray detectors 100 may be tiled side-by-side to form a larger detector. Each of the multiple detectors may have a single or multiple chips. For example, for the application in mammography, the absorption layer may be made on a single silicon wafer, which may be bonded to an electronic layer made on another single silicon wafer. Three to six such detectors may be tiled side-by-side like tiles to form a tiled detector large enough to take X-ray images of a human breast. Multiple tiled detectors may be stacked with the gaps within each layer staggered.

As discussed above, since the electronics layer 120 does not need RDL or TSV, the thickness of the electronics layer 120 may be further reduced to diminish X-ray absorption of the electronics layer 120, especially in a stacked structure shown in FIG. 7A and FIG. 7B. Thus, in the stacked structure shown in FIG. 7A and FIG. 7B, the X-ray absorption layers 110 can be thick enough to provide mechanical support while the electronics layers 120 can be thin enough to improve reduce X-ray blocking and improve DQE.

Figure 8A:
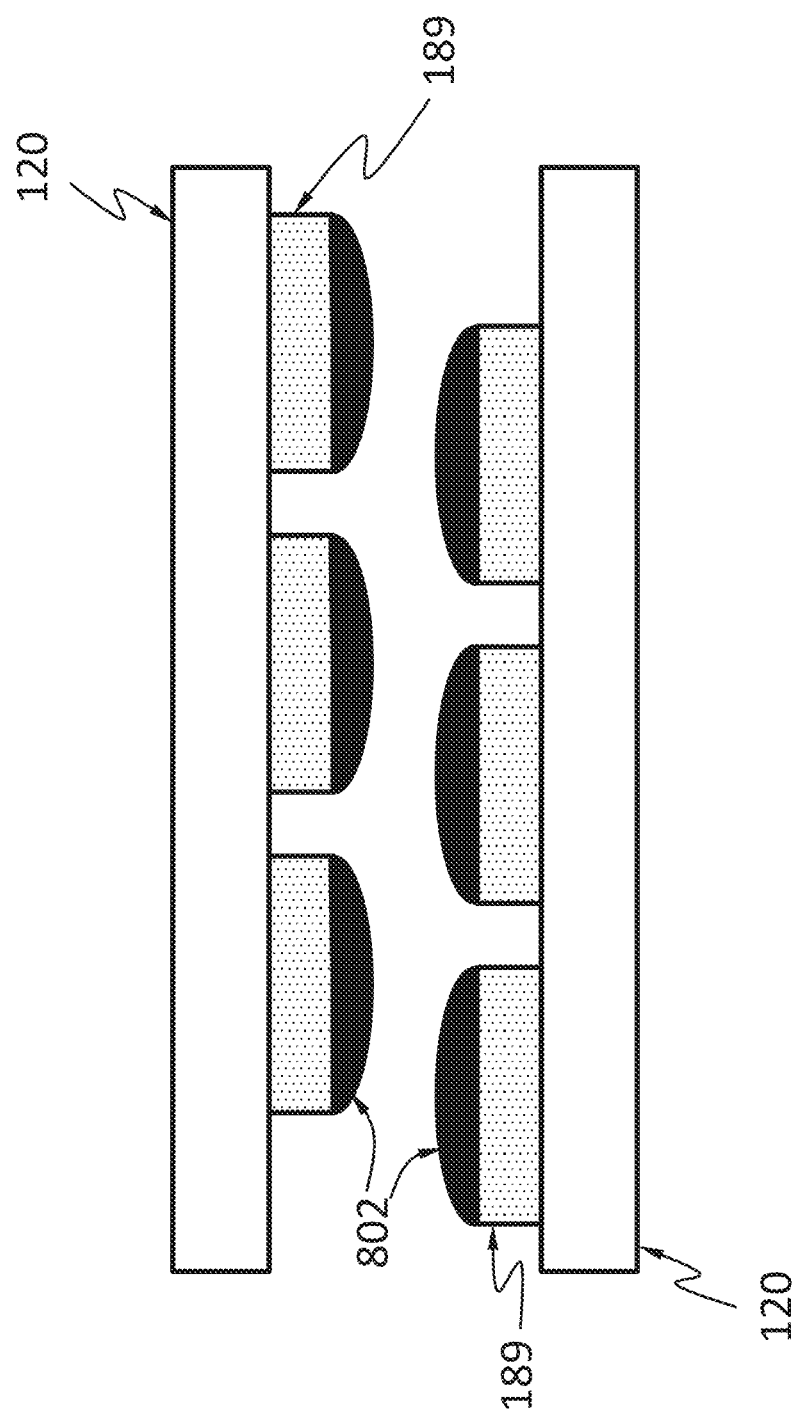
FIG. 8A, FIG. 8B, and FIG. 8C schematically show that two chip-to-wafer structures as shown in FIG. 4E may be stacked to form an X-ray detector, such that the two chip layers are bonded to each other.
Figure 8B:
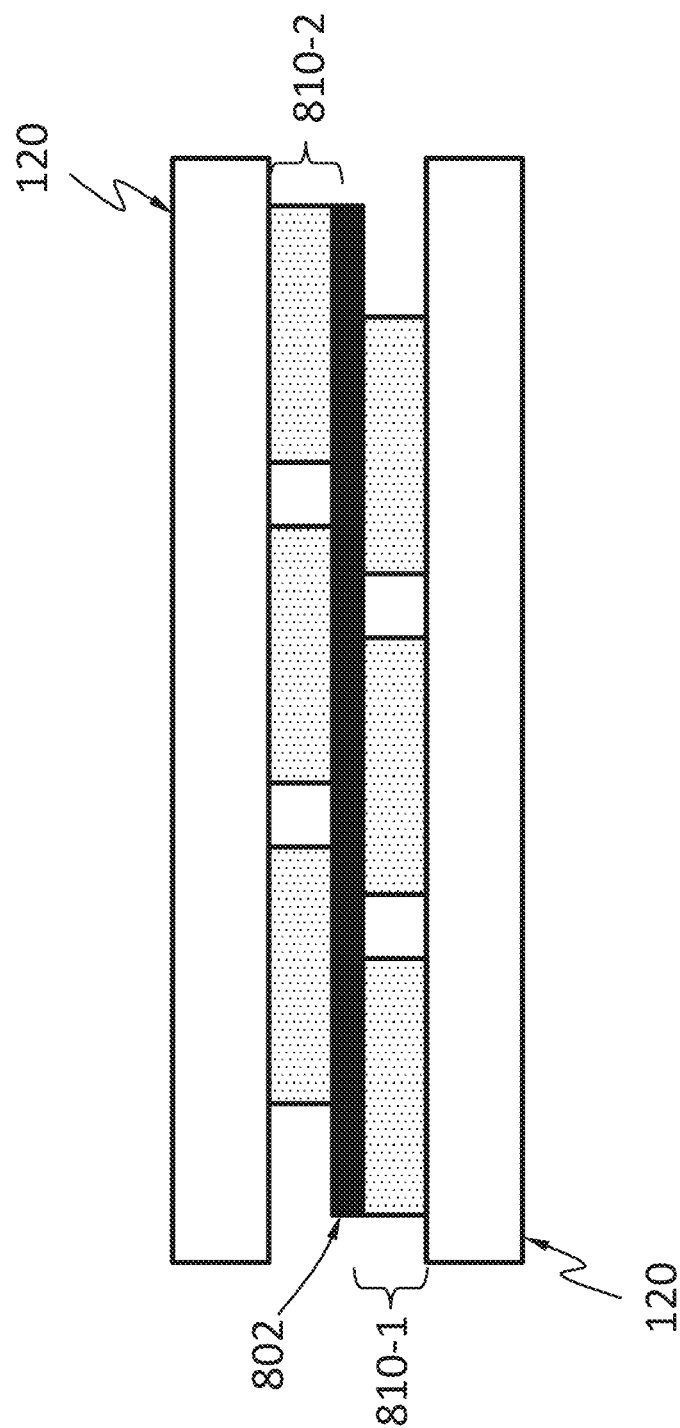
Figure 8C:
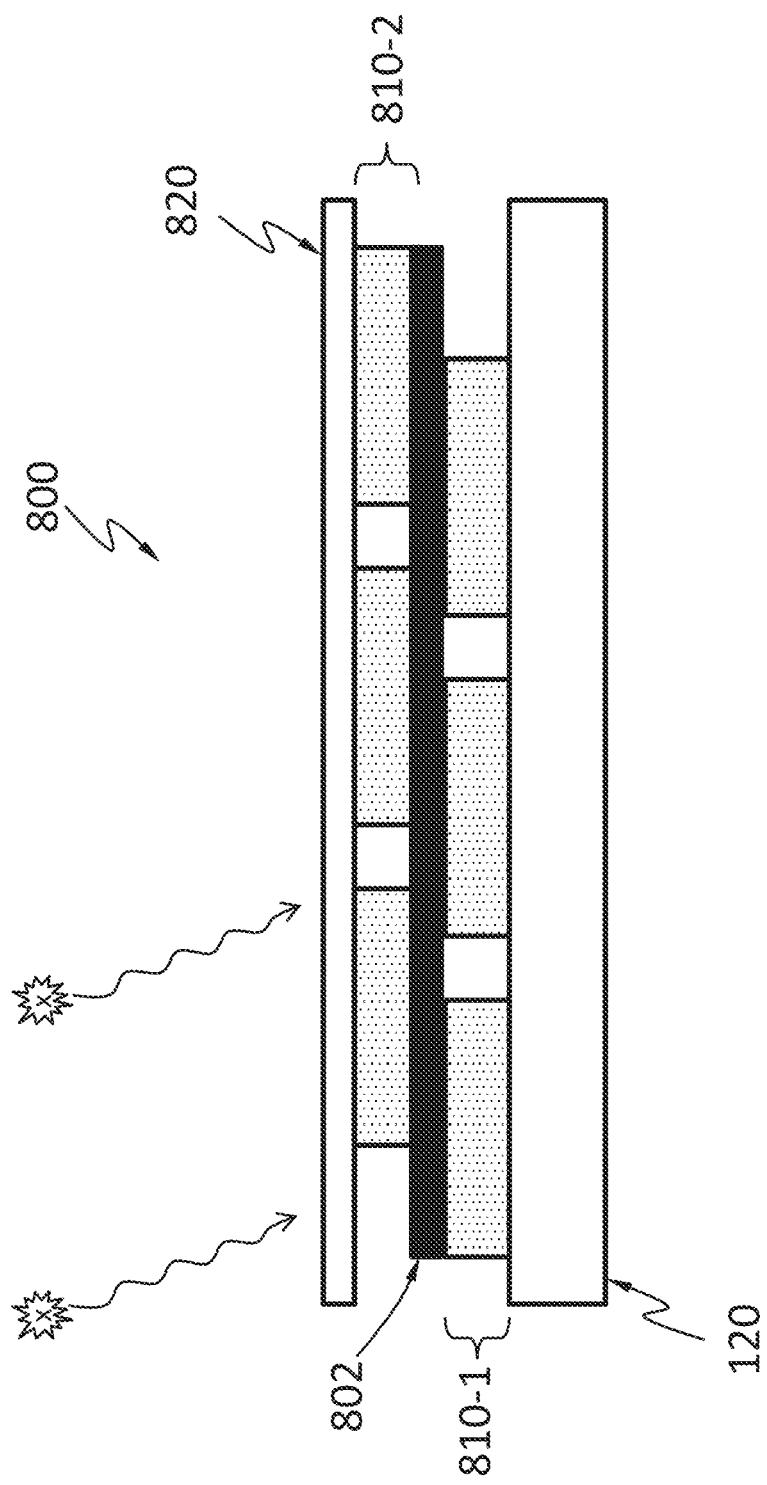

FIG. 8A, FIG. 8B, and FIG. 8C schematically show that two chip-to-wafer structures as shown in FIG. 4E may be stacked to form an X-ray detector 800, such that the two chip layers are bonded to each other. As shown in FIG. 8A, two X-ray detectors 100 as shown in FIG. 4E may be obtained to form a new detector. Each of the two X-ray detectors 100 has the electronics layer 120 and the chips 189 (i.e. the X-ray absorption layer). In one embodiment, some conductive material 802 may be bonded on each of the chips 189. One of the two X-ray detectors 100 may be flipped over such that the two chip layers (i.e. the X-ray absorption layers including chips 189) can be bonded together, e.g. via the conductive material 802.

As shown in FIG. 8B, the two chip layers 810-1, 810-2 may be bonded with the gaps within each layer staggered. In one embodiment, the two chip layers are bonded by the conductive material 802 to be electrically connected to each other. The gaps are staggered as shown in FIG. 8B to eliminate gaps in which incident X-ray photons cannot be detected and to enable all electrodes in the two chip layers to be biased simultaneously. The two chip layers 810-1 and 810-2 may have different thicknesses.

As shown in FIG. 8C, assuming that X-ray photons come from above the X-ray detector 800, the top electronics layer 120 is thinned to form the layer 820 which is the first layer receiving the X-ray photons in the X-ray detector 800. The layer 820 is thin such that its block of the X-ray may be small and negligent. In one embodiment, the layer 820 is thinner than the electronics layer 120. In another embodiment, the layer 820 may have a thickness of 300 microns or less, 200 microns or less, 100 microns or less, 50 microns or less, 20 microns or less, or 5 microns or less.

Figure 9:
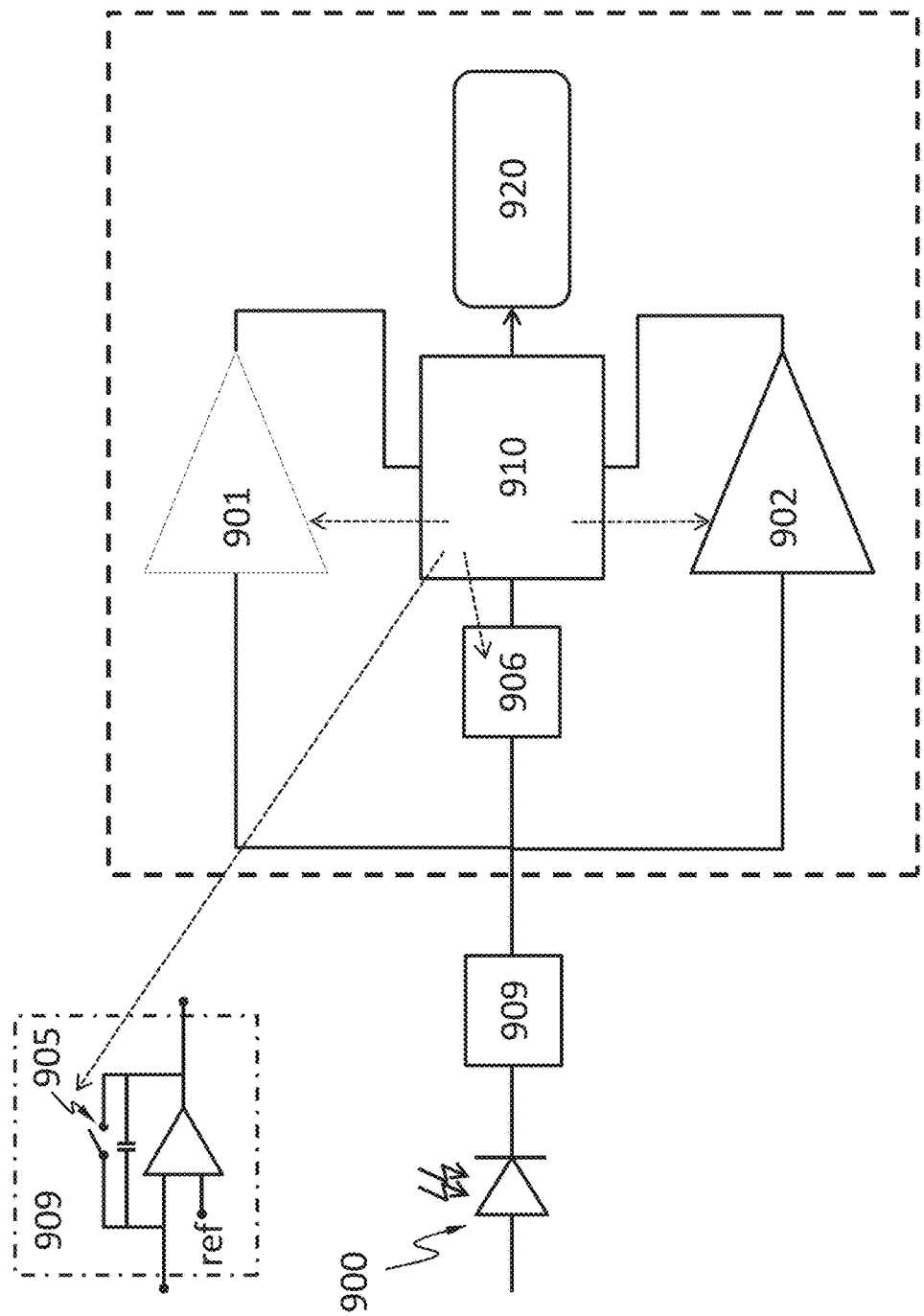
FIG. 9 shows a component diagram of an electronic system of the detector in FIG. 1A or FIG. 1B, according to an embodiment of the present teaching.

FIG. 9 shows an example component diagram of the electronic system 121, according to an embodiment of the present teaching. The electronic system 121 may include a first voltage comparator 901, a second voltage comparator 902, a counter 920, a switch 905, a voltmeter 906 and a controller 910.

The first voltage comparator 901 is configured to compare the voltage of an electrode of a diode 900 to a first threshold. The diode may be a diode formed by the first doped region 111, one of the discrete regions 114 of the second doped region 113, and the optional intrinsic region 112. Alternatively, the first voltage comparator 901 is configured to compare the voltage of an electrical contact (e.g., a discrete portion of electrical contact 119B) to a first threshold. The first voltage comparator 901 may be configured to monitor the voltage directly, or calculate the voltage by integrating an electric current flowing through the diode or electrical contact over a period of time. The first voltage comparator 901 may be controllably activated or deactivated by the controller 910. The first voltage comparator 901 may be a continuous comparator. Namely, the first voltage comparator 901 may be configured to be activated continuously, and monitor the voltage continuously. The first voltage comparator 901 configured as a continuous comparator reduces the chance that the system 121 misses signals generated by an incident X-ray photon. The first voltage comparator 901 configured as a continuous comparator is especially suitable when the incident X-ray intensity is relatively high. The first voltage comparator 901 may be a clocked comparator, which has the benefit of lower power consumption. The first voltage comparator 901 configured as a clocked comparator may cause the system 121 to miss signals generated by some incident X-ray photons. When the incident X-ray intensity is low, the chance of missing an incident X-ray photon is low because the time interval between two successive photons is relatively long. Therefore, the first voltage comparator 901 configured as a clocked comparator is especially suitable when the incident X-ray intensity is relatively low. The first threshold may be 5-10%, 10%-20%, 20-30%, 30-40% or 40-50% of the maximum voltage one incident X-ray photon may generate in the diode or the resistor. The maximum voltage may depend on the energy of the incident X-ray photon (i.e., the wavelength of the incident X-ray), the material of the X-ray absorption layer 110, and other factors. For example, the first threshold may be 50 mV, 100 mV, 150 mV, or 200 mV.

The second voltage comparator 902 is configured to compare the voltage to a second threshold. The second voltage comparator 902 may be configured to monitor the voltage directly, or calculate the voltage by integrating an electric current flowing through the diode or the electrical contact over a period of time. The second voltage comparator 902 may be a continuous comparator. The second voltage comparator 902 may be controllably activate or deactivated by the controller 910. When the second voltage comparator 902 is deactivated, the power consumption of the second voltage comparator 902 may be less than 1%, less than 5%, less than 10% or less than 20% of the power consumption when the second voltage comparator 902 is activated. The absolute value of the second threshold is greater than the absolute value of the first threshold. As used herein, the term "absolute value" or "modulus" |x| of a real number x is the non-negative value of x without regard to its sign. Namely, $$|x| = \begin{cases} x, & \text{if } x \geq 0 \\ -x, & \text{if } x \leq 0 \end{cases}.$$

The second threshold may be 200%-300% of the first threshold. The second threshold may be at least 50% of the maximum voltage one incident X-ray photon may generate in the diode or resistor. For example, the second threshold may be 100 mV, 150 mV, 200 mV, 250 mV or 300 mV. The second voltage comparator 902 and the first voltage comparator 910 may be the same component. Namely, the system 121 may have one voltage comparator that can compare a voltage with two different thresholds at different times.

The first voltage comparator 901 or the second voltage comparator 902 may include one or more op-amps or any other suitable circuitry. The first voltage comparator 901 or the second voltage comparator 902 may have a high speed to allow the system 121 to operate under a high flux of incident X-ray. However, having a high speed is often at the cost of power consumption.

The counter 920 is configured to register a number of X-ray photons reaching the diode or resistor. The counter 920 may be a software component (e.g., a number stored in a computer memory) or a hardware component (e.g., a 4017 IC and a 7490 IC).

The controller 910 may be a hardware component such as a microcontroller and a microprocessor. The controller 910 is configured to start a time delay from a time at which the first voltage comparator 901 determines that the absolute value of the voltage equals or exceeds the absolute value of the first threshold (e.g., the absolute value of the voltage increases from below the absolute value of the first threshold to a value equal to or above the absolute value of the first threshold). The absolute value is used here because the voltage may be negative or positive, depending on whether the voltage of the cathode or the anode of the diode or which electrical contact is used. The controller 910 may be configured to keep deactivated the second voltage comparator 902, the counter 920 and any other circuits the operation of the first voltage comparator 901 does not require, before the time at which the first voltage comparator 901 determines that the absolute value of the voltage equals or exceeds the absolute value of the first threshold. The time delay may expire before or after the voltage becomes stable, i.e., the rate of change of the voltage is substantially zero. The phase "the rate of change of the voltage is substantially zero" means that temporal change of the voltage is less than 0.1%/ns. The phase "the rate of change of the voltage is substantially non-zero" means that temporal change of the voltage is at least 0.1%/ns.

The controller 910 may be configured to activate the second voltage comparator during (including the beginning and the expiration) the time delay. In an embodiment, the controller 910 is configured to activate the second voltage comparator at the beginning of the time delay. The term "activate" means causing the component to enter an operational state (e.g., by sending a signal such as a voltage pulse or a logic level, by providing power, etc.). The term "deactivate" means causing the component to enter a non-operational state (e.g., by sending a signal such as a voltage pulse or a logic level, by cut off power, etc.). The operational state may have higher power consumption (e.g., 10 times higher, 100 times higher, 1000 times higher) than the non-operational state. The controller 910 may be deactivated until the output of the first voltage comparator 901 activates the controller 910 when the absolute value of the voltage equals or exceeds the absolute value of the first threshold.

The controller 910 may be configured to cause the number registered by the counter 920 to increase by one, if, during the time delay, the second voltage comparator 902 determines that the absolute value of the voltage equals or exceeds the absolute value of the second threshold.

The controller 910 may be configured to cause the voltmeter 906 to measure the voltage upon expiration of the time delay. The controller 910 may be configured to connect the electrode to an electrical ground, so as to reset the voltage and discharge any charge carriers accumulated on the electrode. In an embodiment, the electrode is connected to an electrical ground after the expiration of the time delay. In an embodiment, the electrode is connected to an electrical ground for a finite reset time period. The controller 910 may connect the electrode to the electrical ground by controlling the switch 905. The switch may be a transistor such as a field-effect transistor (FET).

In an embodiment, the system 121 has no analog filter network (e.g., a RC network). In an embodiment, the system 121 has no analog circuitry.

The voltmeter 906 may feed the voltage it measures to the controller 910 as an analog or digital signal.

The system 121 may include a capacitor module 909 electrically connected to the electrode of the diode 900 or which electrical contact, wherein the capacitor module is configured to collect charge carriers from the electrode. The capacitor module can include a capacitor in the feedback path of an amplifier. The amplifier configured as such is called a capacitive transimpedance amplifier (CTIA). CTIA has high dynamic range by keeping the amplifier from saturating and improves the signal-to-noise ratio by limiting the bandwidth in the signal path. Charge carriers from the electrode accumulate on the capacitor over a period of time ("integration period"). After the integration period has expired, the capacitor voltage is sampled and then reset by a reset switch. The capacitor module can include a capacitor directly connected to the electrode.

Figure 10:
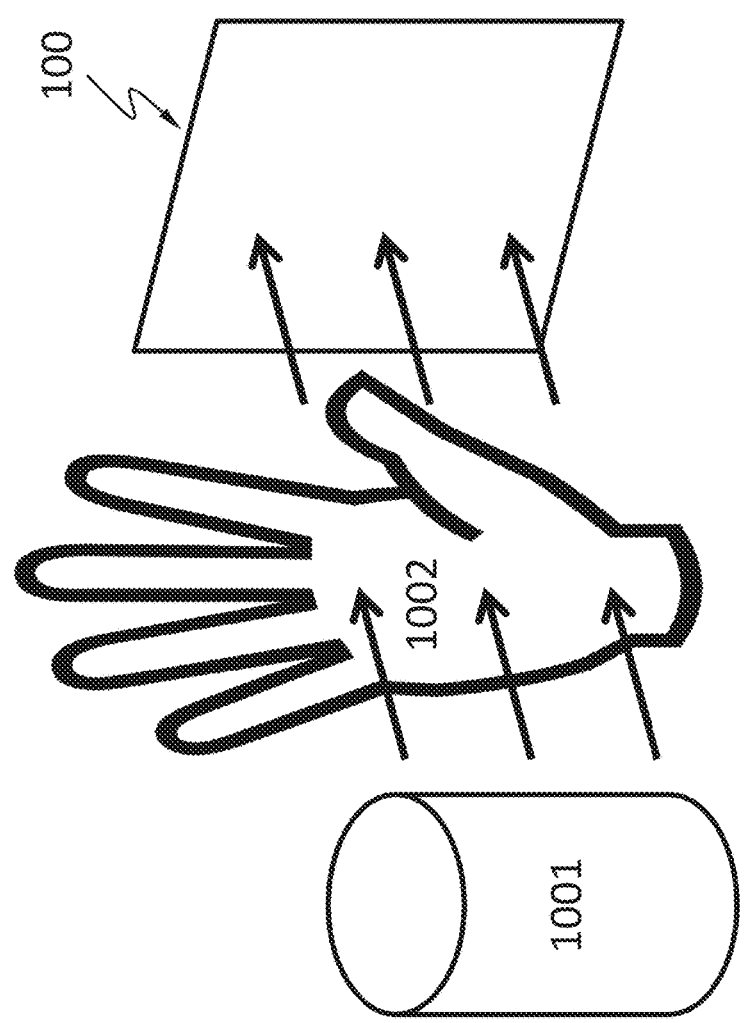
FIG. 10 schematically shows a system comprising the semiconductor X-ray detector described herein, suitable for medical imaging such as chest X-ray radiography, abdominal X-ray radiography, etc., according to an embodiment of the present teaching.

FIG. 10 schematically shows a system comprising the semiconductor X-ray detector 100 described herein. The system may be used for medical imaging such as chest X-ray radiography, abdominal X-ray radiography, etc. The system comprises an X-ray source 1001. X-ray emitted from the X-ray source 1001 penetrates an object 1002 (e.g., a human body part such as chest, limb, abdomen), is attenuated by different degrees by the internal structures of the object 1002 (e.g., bones, muscle, fat and organs, etc.), and is projected to the semiconductor X-ray detector 100. The semiconductor X-ray detector 100 forms an image by detecting the intensity distribution of the X-ray. It can be understood that the semiconductor X-ray detector 100 in this system may be replaced by any of the semiconductor X-ray detectors 510, 520, 610, 620, 700, 800 as disclosed herein.

Figure 11:
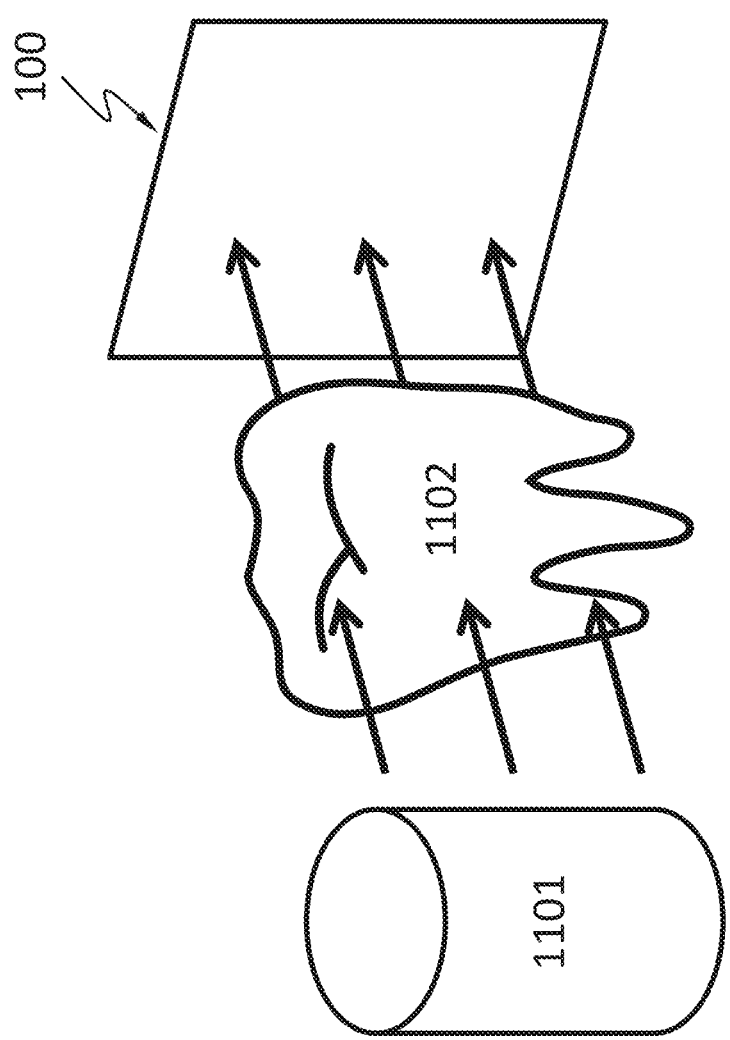
FIG. 11 schematically shows a system comprising the semiconductor X-ray detector described herein suitable for dental X-ray radiography, according to an embodiment of the present teaching.

FIG. 11 schematically shows a system comprising the semiconductor X-ray detector 100 described herein. The system may be used for medical imaging such as dental X-ray radiography. The system comprises an X-ray source 1101. X-ray emitted from the X-ray source 1101 penetrates an object 1102 that is part of a mammal (e.g., human) mouth. The object 1102 may include a maxilla bone, a palate bone, a tooth, the mandible, or the tongue. The X-ray is attenuated by different degrees by the different structures of the object 1102 and is projected to the semiconductor X-ray detector 100. The semiconductor X-ray detector 100 forms an image by detecting the intensity distribution of the X-ray. Teeth absorb X-ray more than dental caries, infections, periodontal ligament. The dosage of X-ray radiation received by a dental patient is typically small (around 0.150 mSv for a full mouth series). It can be understood that the semiconductor X-ray detector 100 in this system may be replaced by any of the semiconductor X-ray detectors 510, 520, 610, 620, 700, 800 as disclosed herein.

Figure 12:
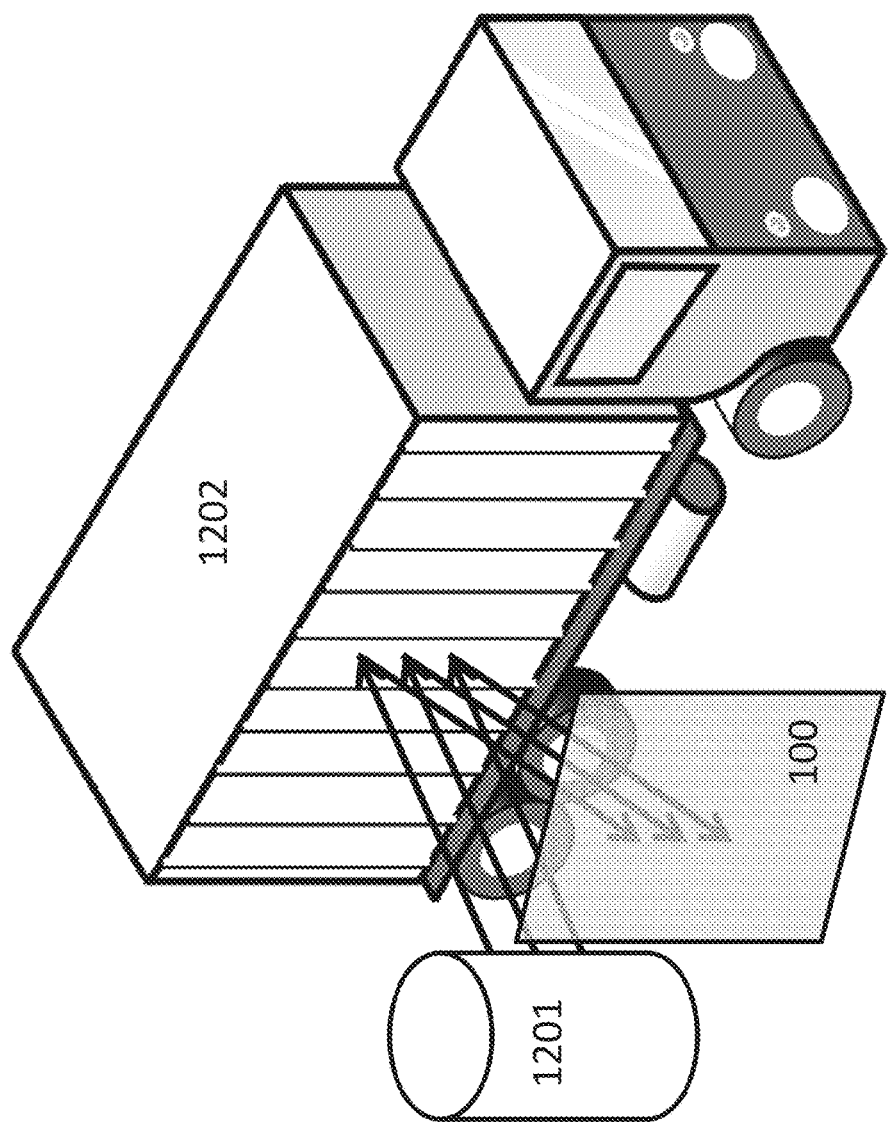
FIG. 12 schematically shows a cargo scanning or non-intrusive inspection (NII) system comprising the semiconductor X-ray detector described herein, according to an embodiment of the present teaching.

FIG. 12 schematically shows a cargo scanning or non-intrusive inspection N system comprising the semiconductor X-ray detector 100 described herein. The system may be used for inspecting and identifying goods in transportation systems such as shipping containers, vehicles, ships, luggage, etc. The system comprises an X-ray source 1201. X-ray emitted from the X-ray source 1201 may backscatter from an object 1202 (e.g., shipping containers, vehicles, ships, etc.) and be projected to the semiconductor X-ray detector 100. Different internal structures of the object 1202 may backscatter X-ray differently. The semiconductor X-ray detector 100 forms an image by detecting the intensity distribution of the backscattered X-ray and/or energies of the backscattered X-ray photons. It can be understood that the semiconductor X-ray detector 100 in this system may be replaced by any of the semiconductor X-ray detectors 510, 520, 610, 620, 700, 800 as disclosed herein.

Figure 13:
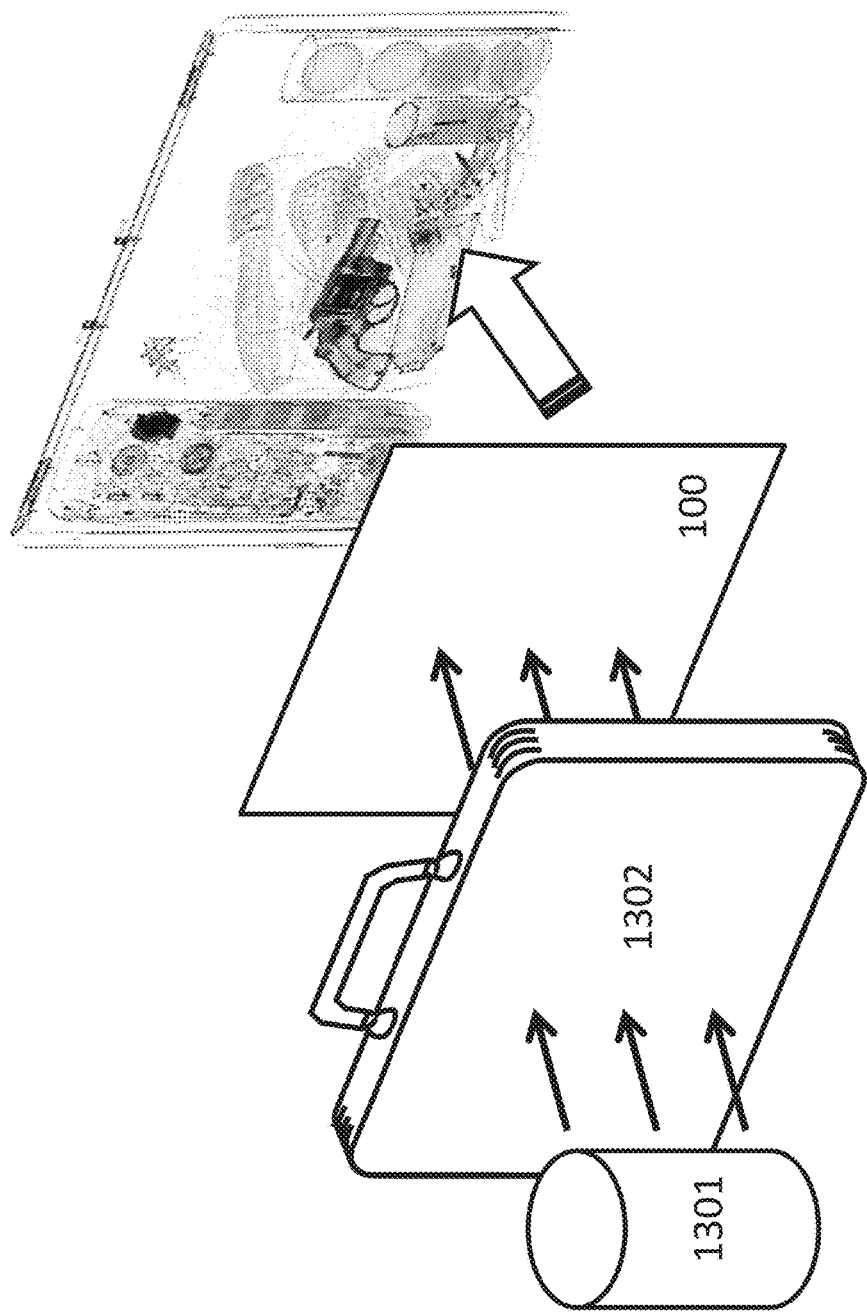
FIG. 13 schematically shows another cargo scanning or non-intrusive inspection (NII) system comprising the semiconductor X-ray detector described herein, according to an embodiment of the present teaching.

FIG. 13 schematically shows another cargo scanning or non-intrusive inspection (NII) system comprising the semiconductor X-ray detector 100 described herein. The system may be used for luggage screening at public transportation stations and airports. The system comprises an X-ray source 1301. X-ray emitted from the X-ray source 1301 may penetrate a piece of luggage 1302, be differently attenuated by the contents of the luggage, and projected to the semiconductor X-ray detector 100. The semiconductor X-ray detector 100 forms an image by detecting the intensity distribution of the transmitted X-ray. The system may reveal contents of luggage and identify items forbidden on public transportation, such as firearms, narcotics, edged weapons, flammables. It can be understood that the semiconductor X-ray detector 100 in this system may be replaced by any of the semiconductor X-ray detectors 510, 520, 610, 620, 700, 800 as disclosed herein.

Figure 14:
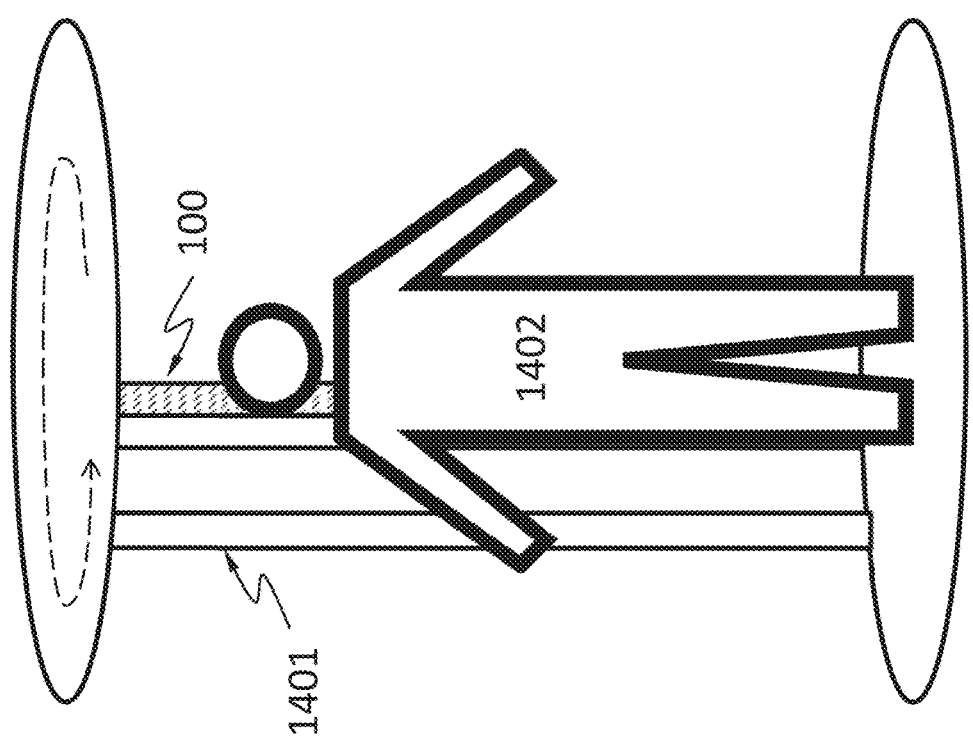
FIG. 14 schematically shows a full-body scanner system comprising the semiconductor X-ray detector described herein, according to an embodiment of the present teaching.

FIG. 14 schematically shows a full-body scanner system comprising the semiconductor X-ray detector 100 described herein. The full-body scanner system may detect objects on a person's body for security screening purposes, without physically removing clothes or making physical contact. The full-body scanner system may be able to detect non-metal objects. The full-body scanner system comprises an X-ray source 1401. X-ray emitted from the X-ray source 1401 may backscatter from a human 1402 being screened and objects thereon, and be projected to the semiconductor X-ray detector 100. The objects and the human body may backscatter X-ray differently. The semiconductor X-ray detector 100 forms an image by detecting the intensity distribution of the backscattered X-ray. The semiconductor X-ray detector 100 and the X-ray source 1401 may be configured to scan the human in a linear or rotational direction. It can be understood that the semiconductor X-ray detector 100 in this system may be replaced by any of the semiconductor X-ray detectors 510, 520, 610, 620, 700, 800 as disclosed herein.

Figure 15:
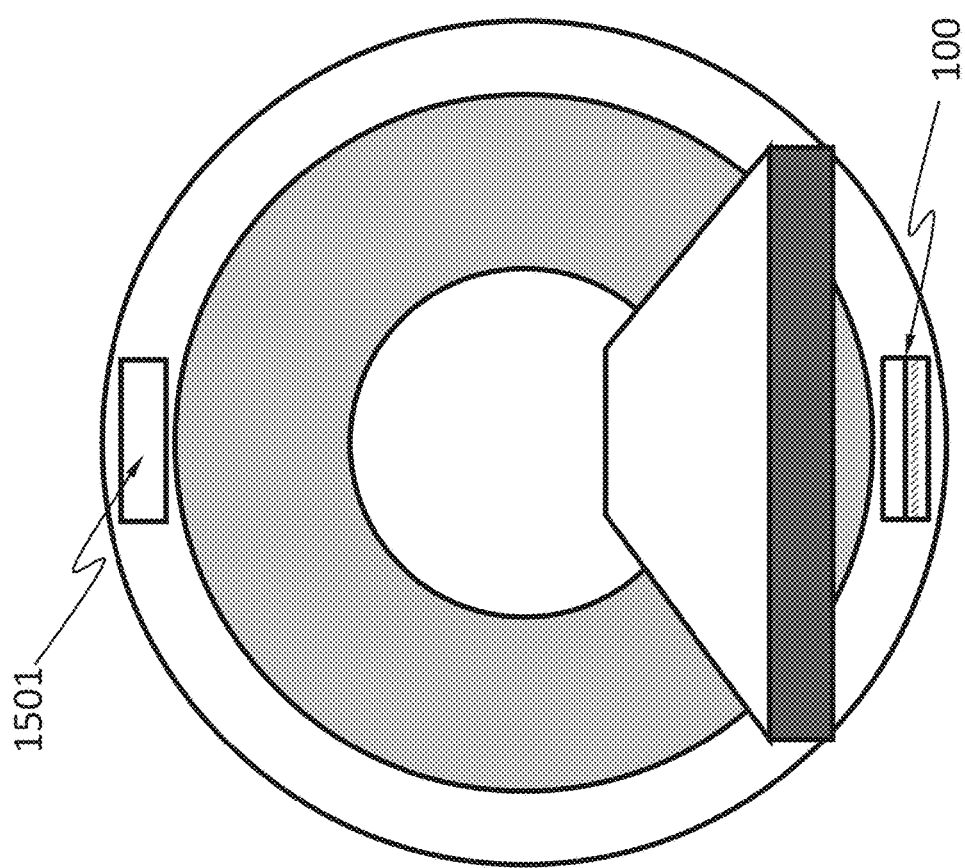
FIG. 15 schematically shows an X-ray computed tomography (X-ray CT) system comprising the semiconductor X-ray detector described herein, according to an embodiment of the present teaching.

FIG. 15 schematically shows an X-ray computed tomography (X-ray CT) system. The X-ray CT system uses computer-processed X-rays to produce tomographic images (virtual "slices") of specific areas of a scanned object. The tomographic images may be used for diagnostic and therapeutic purposes in various medical disciplines, or for flaw detection, failure analysis, metrology, assembly analysis and reverse engineering. The X-ray CT system comprises the semiconductor X-ray detector 100 described herein and an X-ray source 1501. The semiconductor X-ray detector 100 and the X-ray source 1501 may be configured to rotate synchronously along one or more circular or spiral paths. It can be understood that the semiconductor X-ray detector 100 in this system may be replaced by any of the semiconductor X-ray detectors 510, 520, 610, 620, 700, 800 as disclosed herein.

Figure 16:
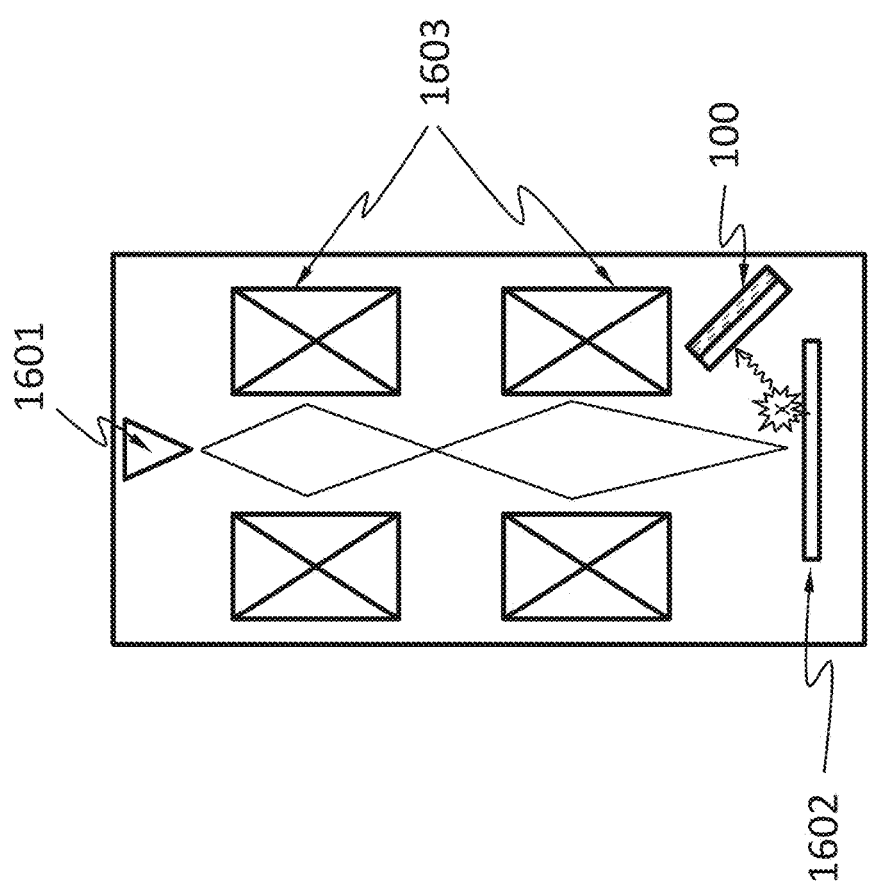
FIG. 16 schematically shows an electron microscope comprising the semiconductor X-ray detector described herein, according to an embodiment of the present teaching.

FIG. 16 schematically shows an electron microscope. The electron r microscope comprises an electron source 1601 (also called an electron gun) that is configured to emit electrons. The electron source 1601 may have various emission mechanisms such as thermionic, photocathode, cold emission, or plasmas source. The emitted electrons pass through an electronic optical system 1603, which may be configured to shape, accelerate, or focus the electrons. The electrons then reach a sample 1602 and an image detector may form an image therefrom. The electron microscope may comprise the semiconductor X-ray detector 100 described herein, for performing energy-dispersive X-ray spectroscopy (EDS). EDS is an analytical technique used for the elemental analysis or chemical characterization of a sample. When the electrons incident on a sample, they cause emission of characteristic X-rays from the sample. The incident electrons may excite an electron in an inner shell of an atom in the sample, ejecting it from the shell while creating an electron hole where the electron was. An electron from an outer, higher-energy shell then fills the hole, and the difference in energy between the higher-energy shell and the lower energy shell may be released in the form of an X-ray. The number and energy of the X-rays emitted from the sample can be measured by the semiconductor X-ray detector 100. It can be understood that the semiconductor X-ray detector 100 in this system may be replaced by any of the semiconductor X-ray detectors 510, 520, 610, 620, 700, 800 as disclosed herein.

The semiconductor X-ray detectors 100, 510, 520, 610, 620, 700, 800 described here may have other applications such as in an X-ray telescope, X-ray mammography, industrial X-ray defect detection, X-ray microscopy or microradiography, X-ray casting inspection, X-ray non-destructive testing, X-ray weld inspection, X-ray digital subtraction angiography, etc. It may be suitable to use any of the semiconductor X-ray detectors 100, 510, 520, 610, 620, 700, 800 in place of a photographic plate, a photographic film, a PSP plate, an X-ray image intensifier, a scintillator, or another semiconductor X-ray detector.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An apparatus suitable for detecting X-ray, the apparatus comprising:
 a first substrate comprising a plurality of first electric contacts;
 a first chip layer comprising a plurality of first chips, wherein each of the first chips comprises a first electrode and is bonded to the first substrate such that the first electrode is electrically connected to at least one of the first electrical contacts;
 a second substrate comprising a plurality of second electric contacts; and
 a second chip layer comprising a plurality of second chips, wherein each of the second chips comprises a second electrode and is bonded to the second substrate such that the second electrode is electrically connected to at least one of the second electrical contacts,
 wherein the first chip layer and the second chip layer are bonded to each other such that at least two second chips are bonded to a same first chip.

2. The apparatus of claim 1, wherein the first chip layer and the second chip layer are bonded using a conductive material.

3. The apparatus of claim 1, wherein the first chip layer and the second chip layer are sandwiched between the first substrate and the second substrate.

4. The apparatus of claim 1, wherein the at least two second chips and the same first chip are directly connected to a same electrode.

5. The apparatus of claim 1, wherein at least one of the first chip layer and the second chip layer is configured for absorbing X-ray.

6. The apparatus of claim 5, wherein at least one of the first substrate and the second substrate comprises an electronic system configured for processing signals generated by the absorbed X-ray.

7. The apparatus of claim 1, wherein the second substrate is thinner than the first substrate.

8. The apparatus of claim 1, wherein the first chip layer and the second chip layer comprise silicon, germanium, GaAs, CdTe, CdZnTe, or a combination thereof.

9. A method for making an apparatus suitable for detecting X-ray, the method comprising:
bonding a plurality of first chips to a first substrate to form a first chip layer, wherein the first substrate comprises a plurality of first electric contacts, wherein each of the first chips comprises a first electrode, and wherein the plurality of first chips are bonded to the first substrate such that each first electrode is electrically connected to at least one of the first electrical contacts;
bonding a plurality of second chips to a second substrate to form a second chip layer, wherein the second substrate comprises a plurality of second electric contacts, wherein each of the second chips comprises a second electrode, and wherein the plurality of second chips are bonded to the second substrate such that each second electrode is electrically connected to at least one of the second electrical contacts; and
bonding the first chip layer and the second chip layer to each other such that at least two second chips are bonded to a same first chip.

10. The method of claim 9, wherein the first chip layer and the second chip layer are bonded using a conductive material.

11. The method of claim 9, wherein the first chip layer and the second chip layer are sandwiched between the first substrate and the second substrate in the apparatus.

12. The method of claim 9, wherein the at least two second chips and the same first chip are directly connected to a same electrode.

13. The method of claim 9, wherein at least one of the first chip layer and the second chip layer is configured for absorbing X-ray.

14. The method of claim 13, wherein at least one of the first substrate and the second substrate comprises an electronic system configured for processing signals generated by the absorbed X-ray.

15. The method of claim 9, wherein the second substrate is thinner than the first substrate.

16. A method for making an apparatus suitable for detecting X-ray, the method comprising:
bonding a plurality of chips to a substrate, wherein the substrate comprises a plurality of electric contacts, wherein each of the chips comprises an X-ray absorption layer comprising an electrode, and wherein the plurality of chips are bonded to the substrate such that each electrode is electrically connected to at least one of the electrical contacts; and
electrically connecting the plurality of chips by a material on top side of the chips.

17. The method of claim 16, wherein the material is not in form of a wafer.

18. The method of claim 16, wherein the plurality of chips are electrically connected by electrical wires or conductive tapes.

19. The method of claim 16, wherein electrically connecting the plurality of chips comprises sputtering a metal layer on top of the plurality of chips.

20. The method of claim 19, wherein electrically connecting the plurality of chips further comprises filling gaps between the chips with insulating material or covering the gaps between the chips with insulating tapes.

21. A method for making an apparatus suitable for detecting X-ray, the method comprising bonding a plurality of chips to a substrate having a first surface and a second surface, wherein:
each of the chips comprises an X-ray absorption layer comprising an electrode;
the substrate comprises electronics comprising a plurality of electric contacts;
the plurality of chips are bonded to the substrate such that each electrode is electrically connected to at least one of the electrical contacts, and
the second surface is free of the electronics.

22. The method of claim 21, further comprising thinning the substrate from the second surface.

23. The method of claim 21, wherein the electronics include electrical wires each of which electrically connects at least some of the electrical contacts.

24. The method of claim 23, wherein signals from the electric contacts can be read out via the electrical wires.

25. The method of claim 23, wherein each of the electrical wires extends across multiple dies that are connected on the first surface during exposure.

26. The method of claim 25, wherein the multiple dies are connected along a first direction.

27. The method of claim 26, wherein a test pattern is placed in a gap between two dies along a second direction during exposure.

28. The method of claim 23, wherein one end of each of the electrical wires is shifted relative to the other end by an integer multiple of a pitch of the electrical wires.

29. The method of claim 21, wherein the electronics include an electronics system, the electronics system comprising:
a first voltage comparator configured to compare a voltage of the electrode to a first threshold;
a second voltage comparator configured to compare the voltage to a second threshold;
a counter configured to register a number of X-ray photons reaching the X-ray absorption layer,
a controller;
wherein the controller is configured to start a time delay from a time at which the first voltage comparator determines that an absolute value of the voltage equals or exceeds an absolute value of the first threshold;
wherein the controller is configured to activate the second voltage comparator during the time delay;
wherein the controller is configured to cause the number registered by the counter to increase by one, if the second voltage comparator determines that an absolute value of the voltage equals or exceeds an absolute value of the second threshold.

* * * * *